United States Patent
Chen et al.

(10) Patent No.: US 11,532,744 B2
(45) Date of Patent: Dec. 20, 2022

(54) GATE CUT STRUCTURE AND METHOD OF FORMING THE SAME

(71) Applicant: Taiwan Semiconductor Manufacturing Company, Ltd., Hsinchu (TW)

(72) Inventors: Chun-Yuan Chen, Hsinchu (TW); Pei-Yu Wang, Hsinchu (TW); Huan-Chieh Su, Changhua County (TW); Yi-Hsun Chiu, Hsinchu County (TW); Cheng-Chi Chuang, New Taipei (TW); Ching-Wei Tsai, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 32 days.

(21) Appl. No.: 17/164,643

(22) Filed: Feb. 1, 2021

(65) Prior Publication Data
US 2022/0131004 A1 Apr. 28, 2022

Related U.S. Application Data

(60) Provisional application No. 63/105,502, filed on Oct. 26, 2020.

(51) Int. Cl.
*H01L 29/78* (2006.01)
*H01L 29/423* (2006.01)
(Continued)

(52) U.S. Cl.
CPC ...... *H01L 29/7831* (2013.01); *H01L 29/0649* (2013.01); *H01L 29/42372* (2013.01); *H01L 29/42392* (2013.01); *H01L 29/66484* (2013.01)

(58) Field of Classification Search
CPC ......... H01L 29/66545; H01L 21/28008; H01L 21/283

See application file for complete search history.

(56) References Cited

U.S. PATENT DOCUMENTS 9,818,872 B2 11/2017 Ching et al.
9,887,269 B2 2/2018 Ching et al.
(Continued)

FOREIGN PATENT DOCUMENTS

DE 102018115901 A1 1/2020
DE 102018126937 A1 2/2020
(Continued)

*Primary Examiner* — Changhyun Yi
(74) *Attorney, Agent, or Firm* — Haynes and Boone, LLP

(57) ABSTRACT

Semiconductor devices and methods of forming the same are provided. A semiconductor device according to the present disclosure includes a first gate structure disposed over a first backside dielectric feature, a second gate structure disposed over a second backside dielectric feature, a gate cut feature extending continuously from between the first gate structure and the second gate structure to between the first backside dielectric feature and the second backside dielectric feature, and a liner disposed between the gate cut feature and the first backside dielectric feature and between the gate cut feature and the second backside dielectric feature.

20 Claims, 38 Drawing Sheets

(51) Int. Cl.
*H01L 29/66* (2006.01)
*H01L 29/06* (2006.01)

(56) References Cited

U.S. PATENT DOCUMENTS

| | | |
|---|---|---|
| 9,899,398 B1 | 2/2018 | Colinge et al. |
| 9,916,982 B1 * | 3/2018 | Wu .................... H01L 21/8234 |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 10,699,957 B2 * | 6/2020 | Zang ................. H01L 21/31116 |
| 2018/0175036 A1 | 6/2018 | Ching et al. |
| 2019/0311950 A1 | 10/2019 | Mehandru |
| 2019/0341297 A1 | 11/2019 | Lilak et al. |
| 2020/0035560 A1 | 1/2020 | Block et al. |
| 2020/0168509 A1 | 5/2020 | Zang et al. |

FOREIGN PATENT DOCUMENTS

| | | |
|---|---|---|
| TW | 1671903 B | 9/2019 |
| TW | 1693677 B | 5/2020 |
| TW | 202021044 A | 6/2020 |
| TW | 1707430 B | 10/2020 |

\* cited by examiner

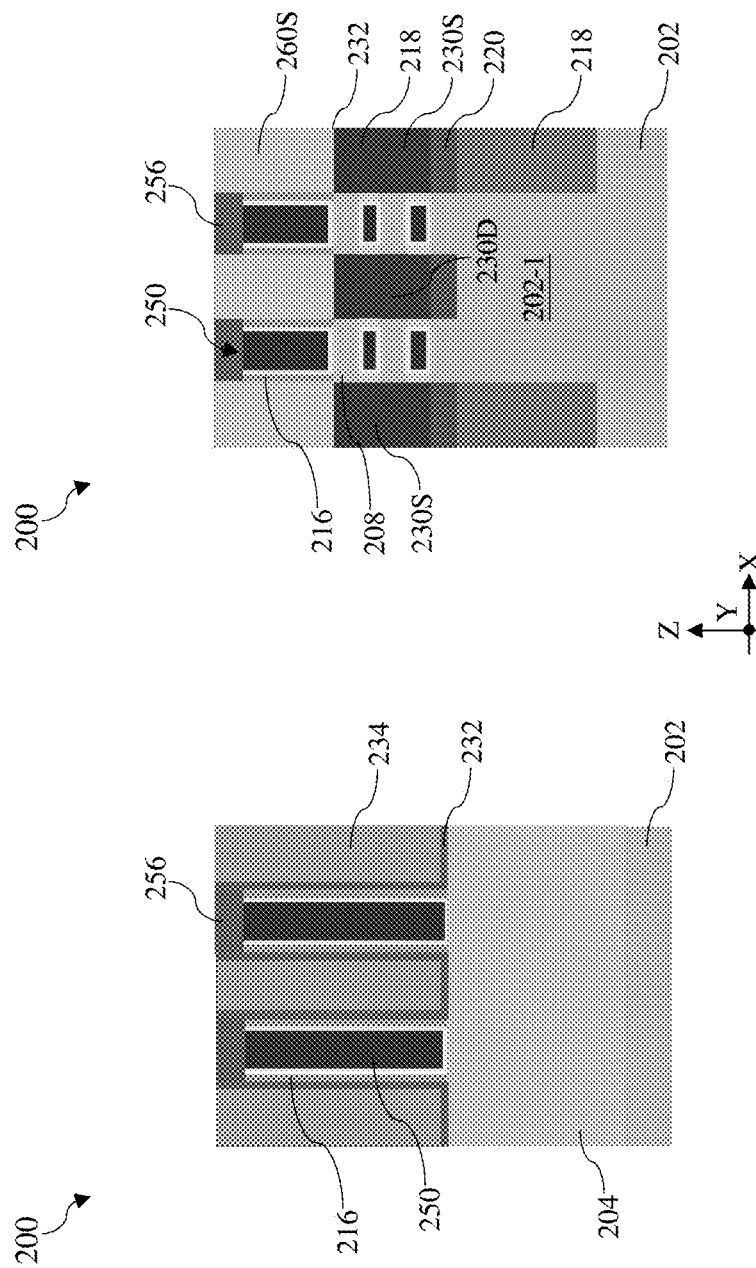

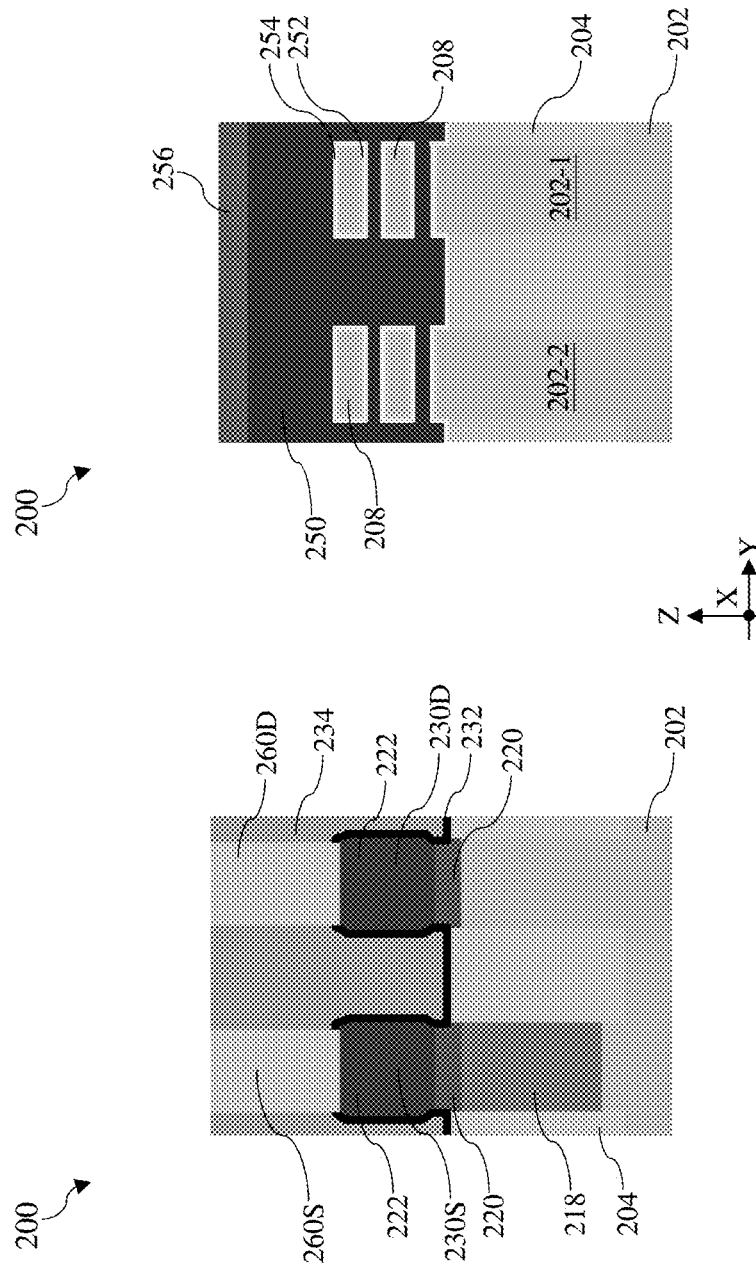

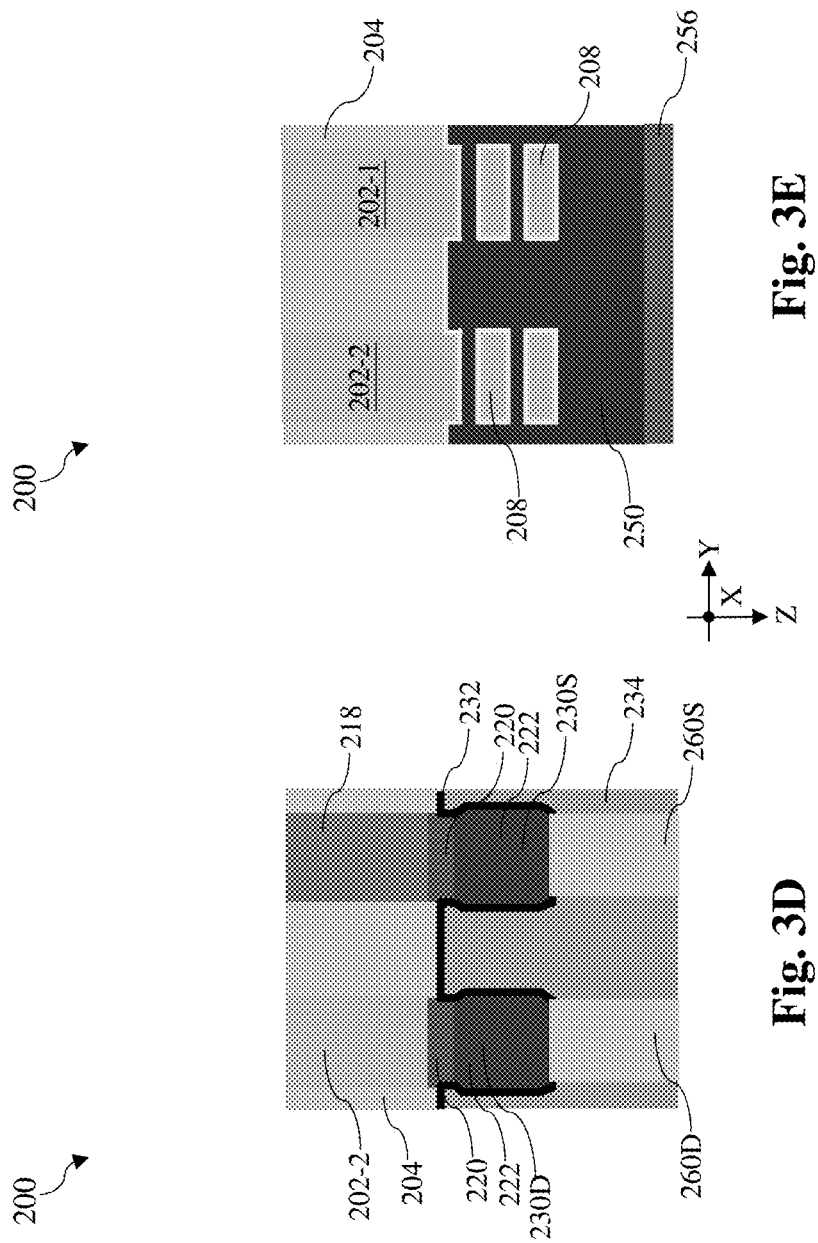

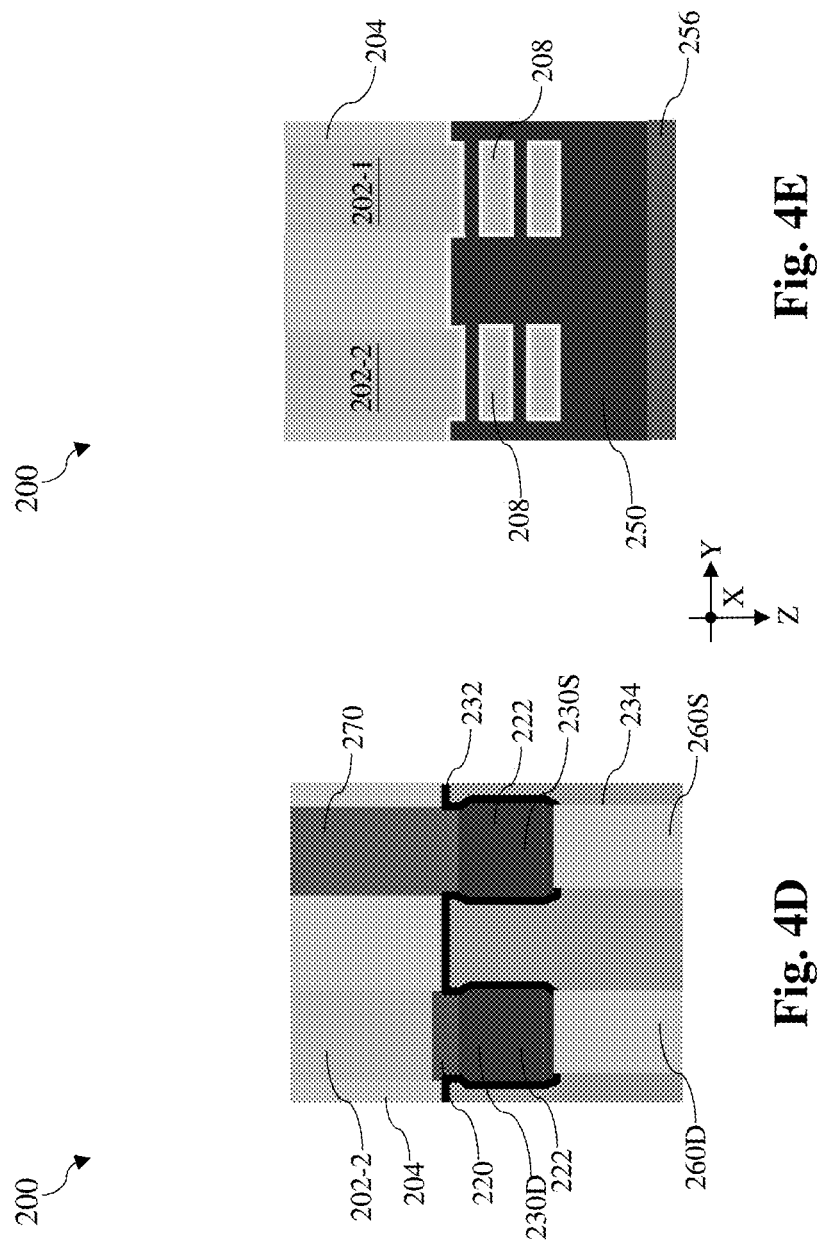

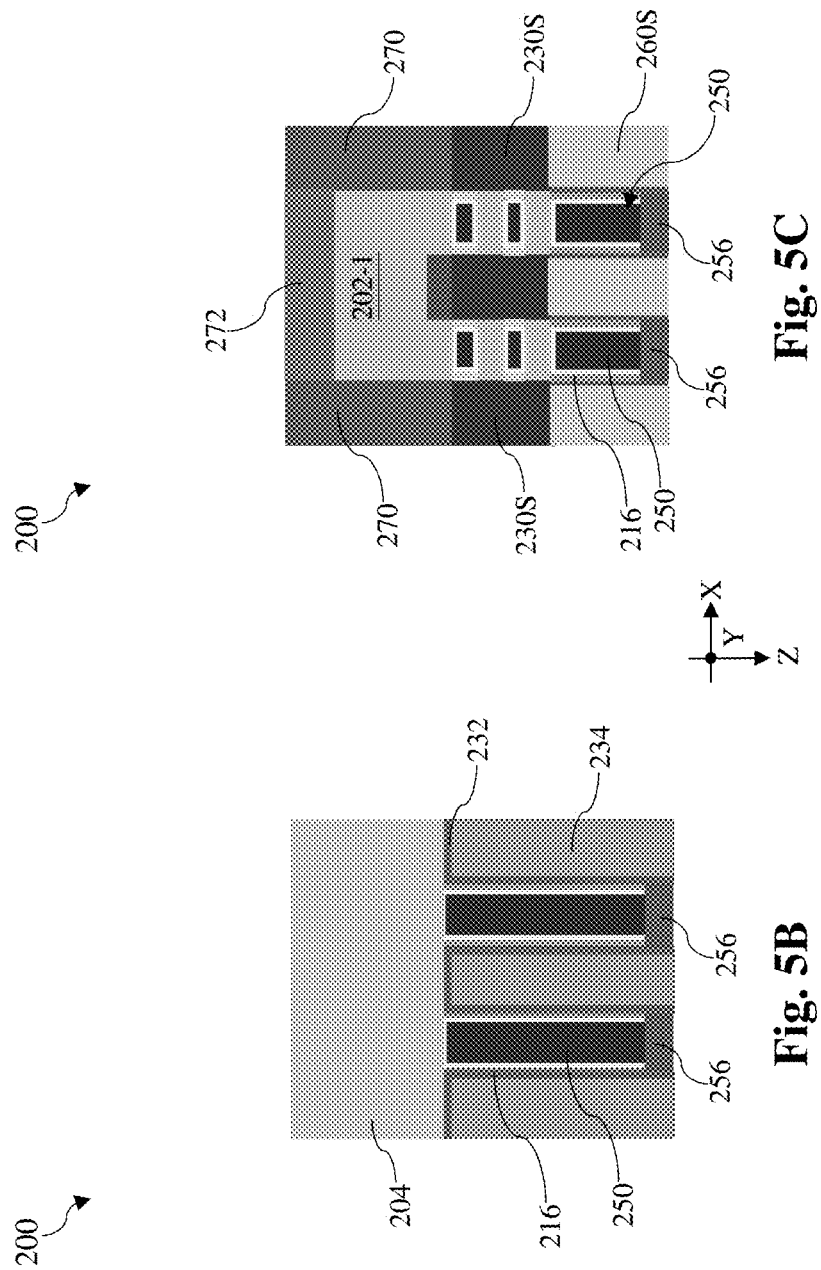

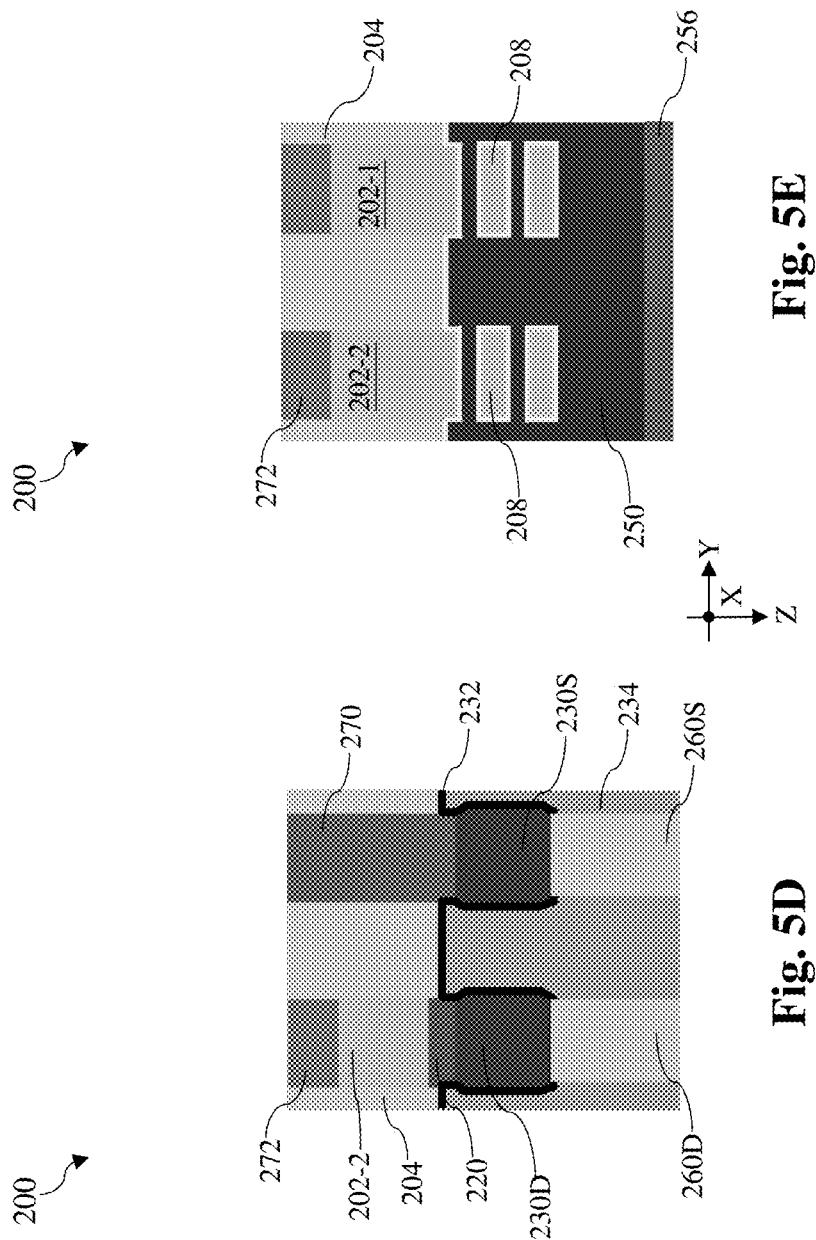

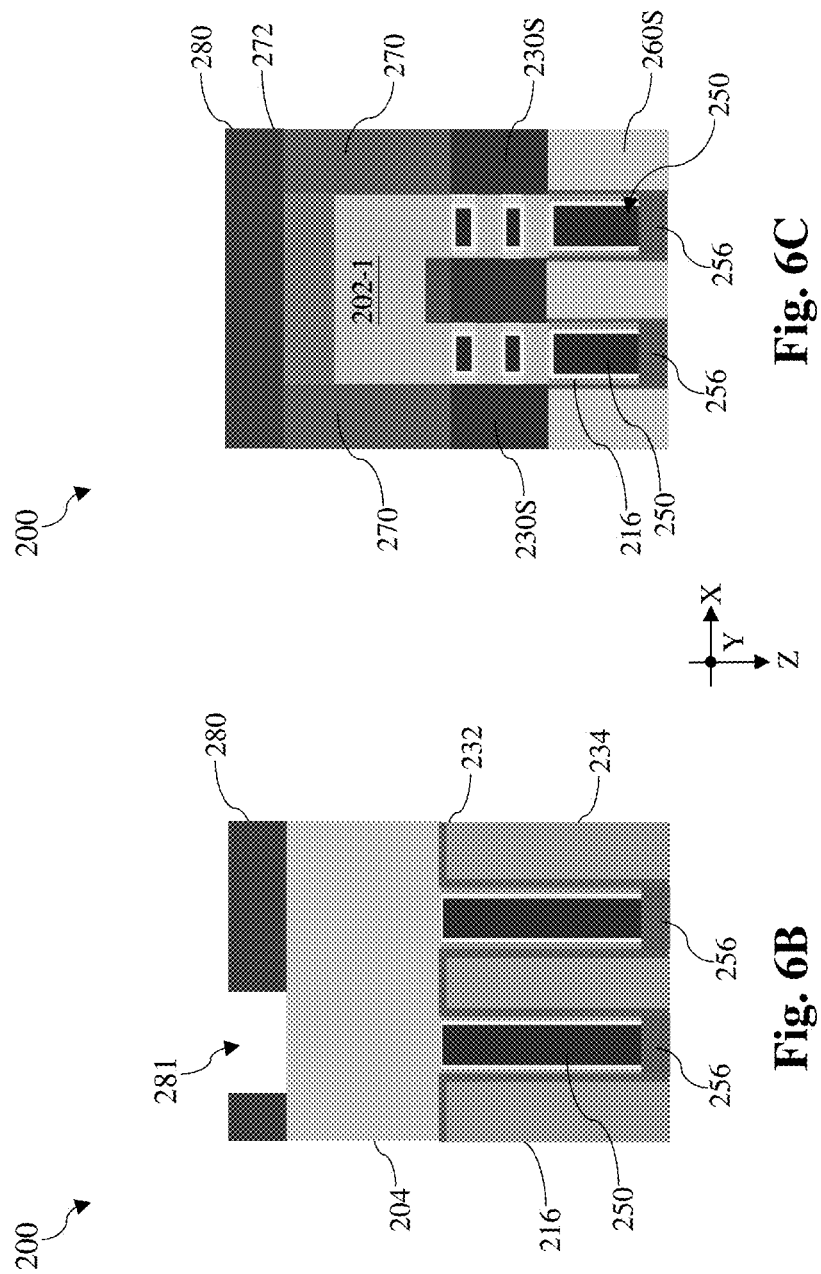

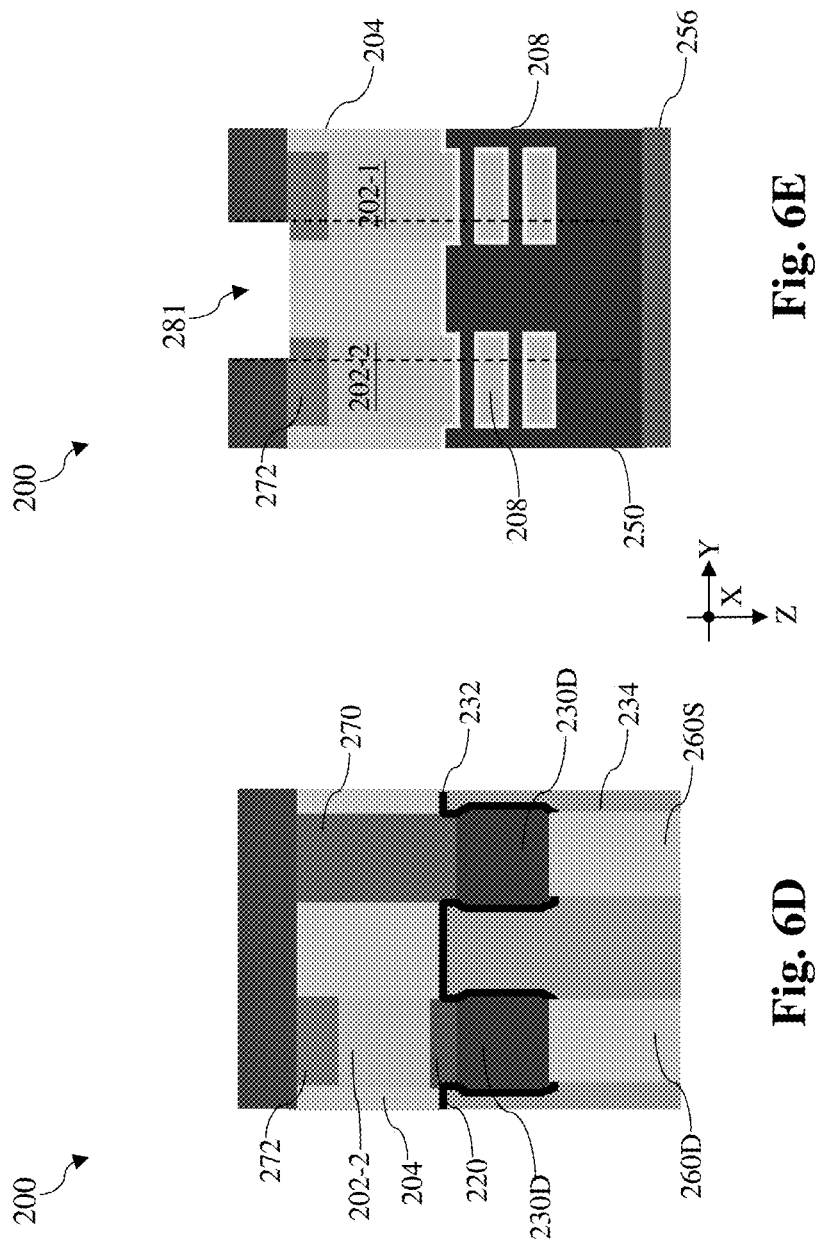

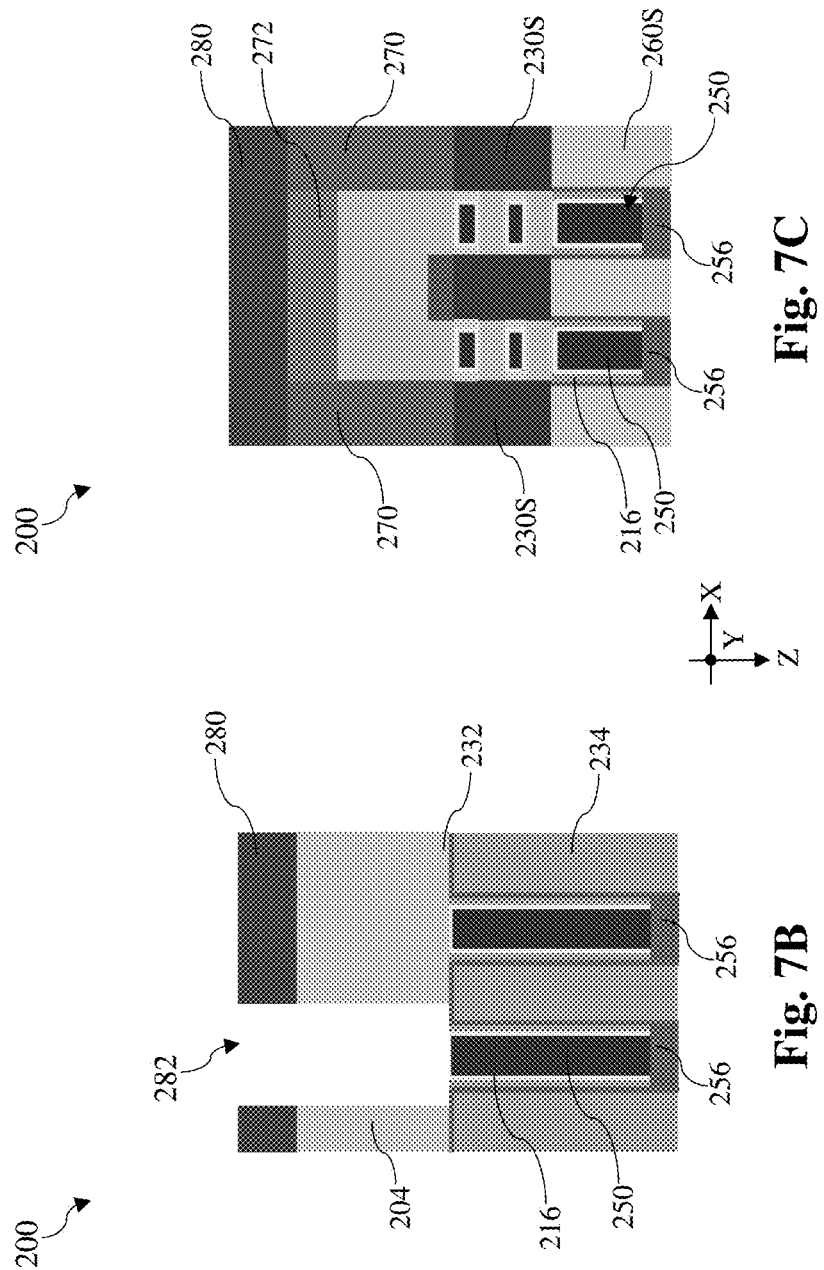

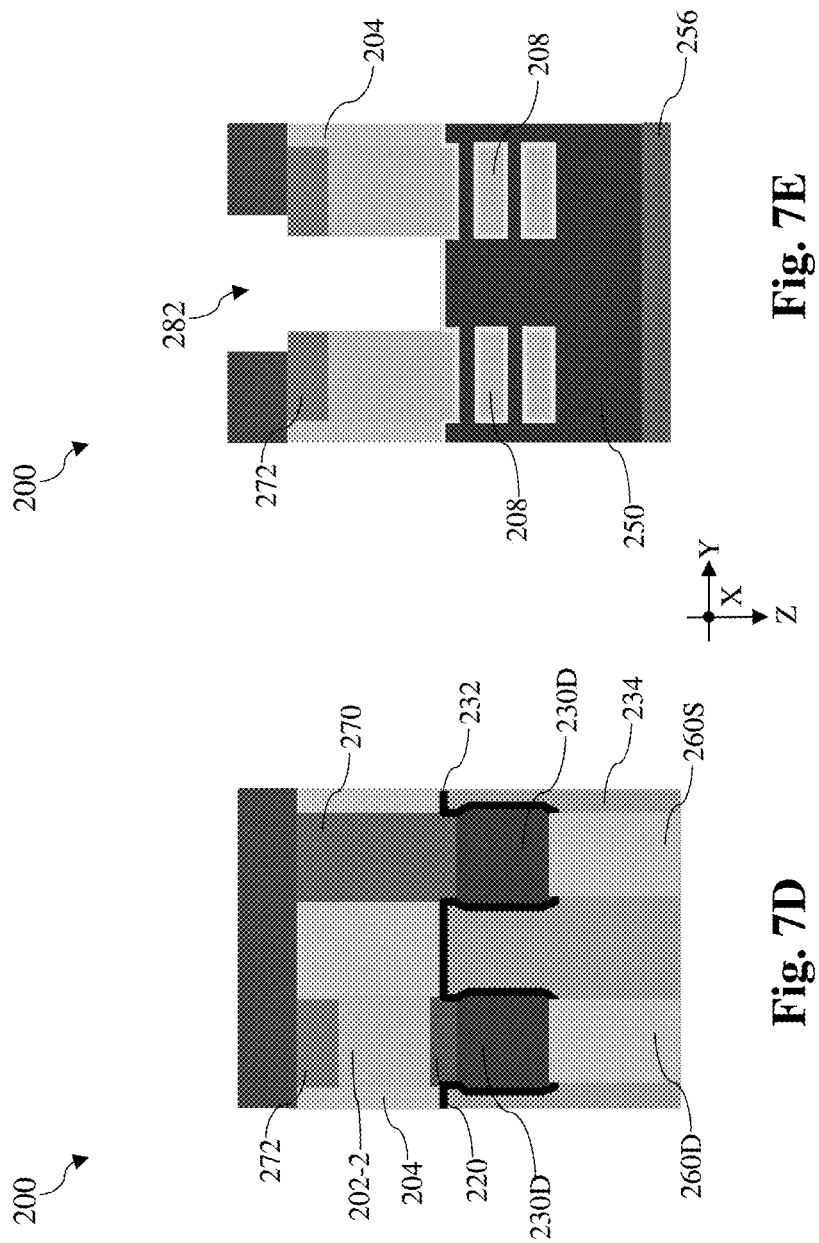

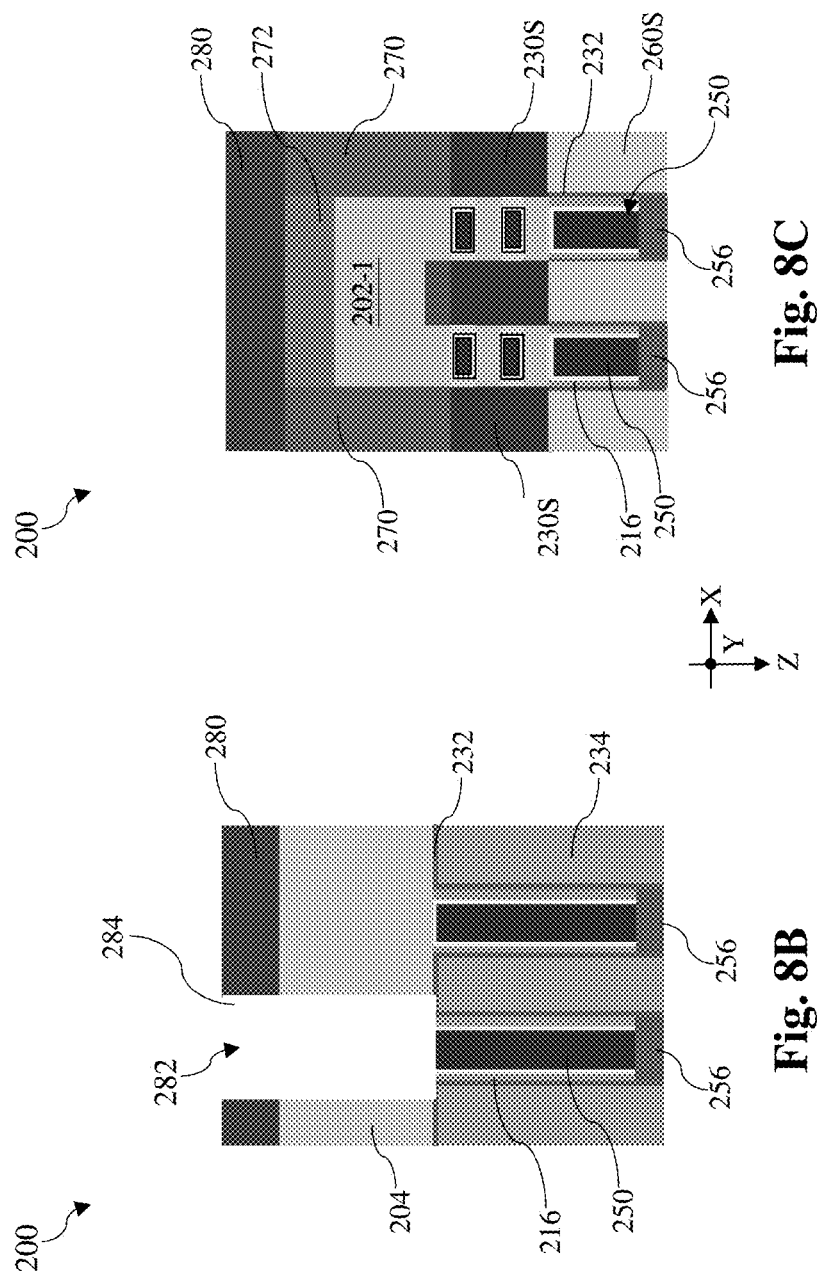

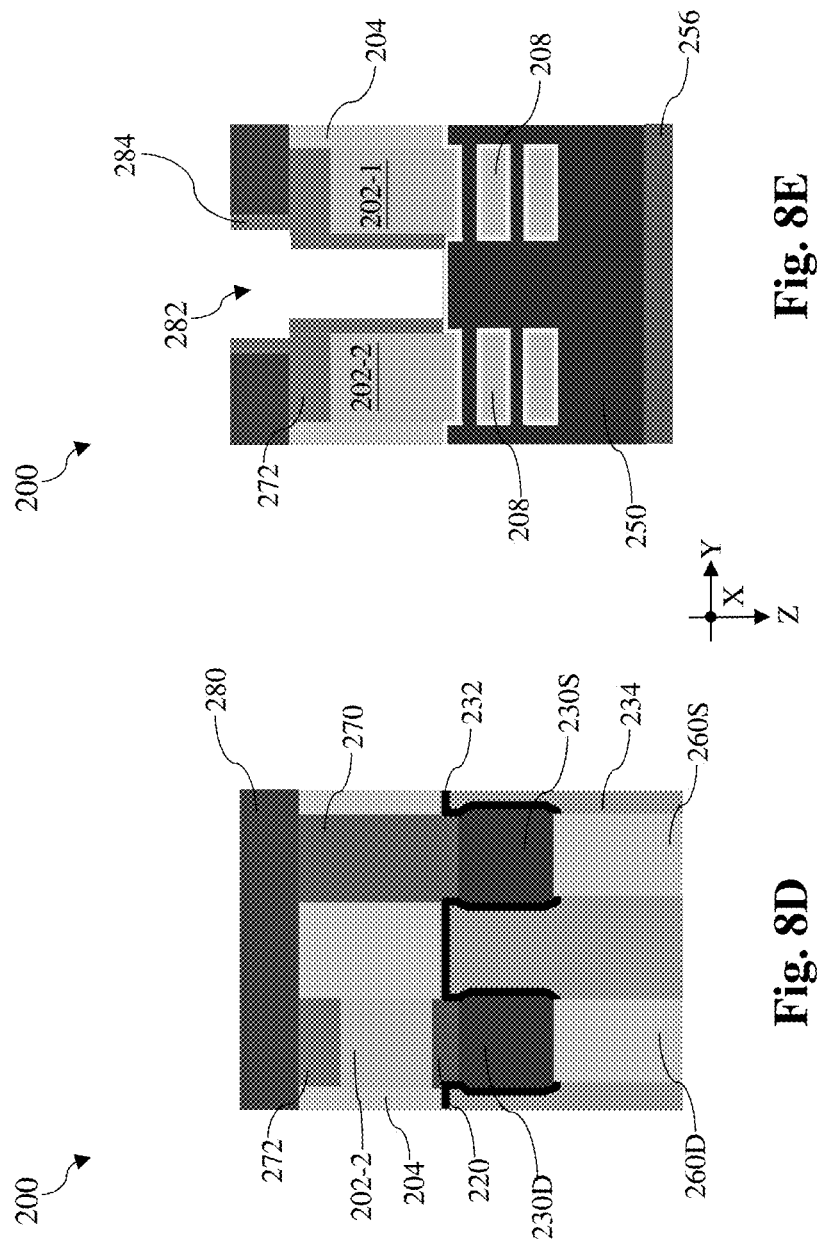

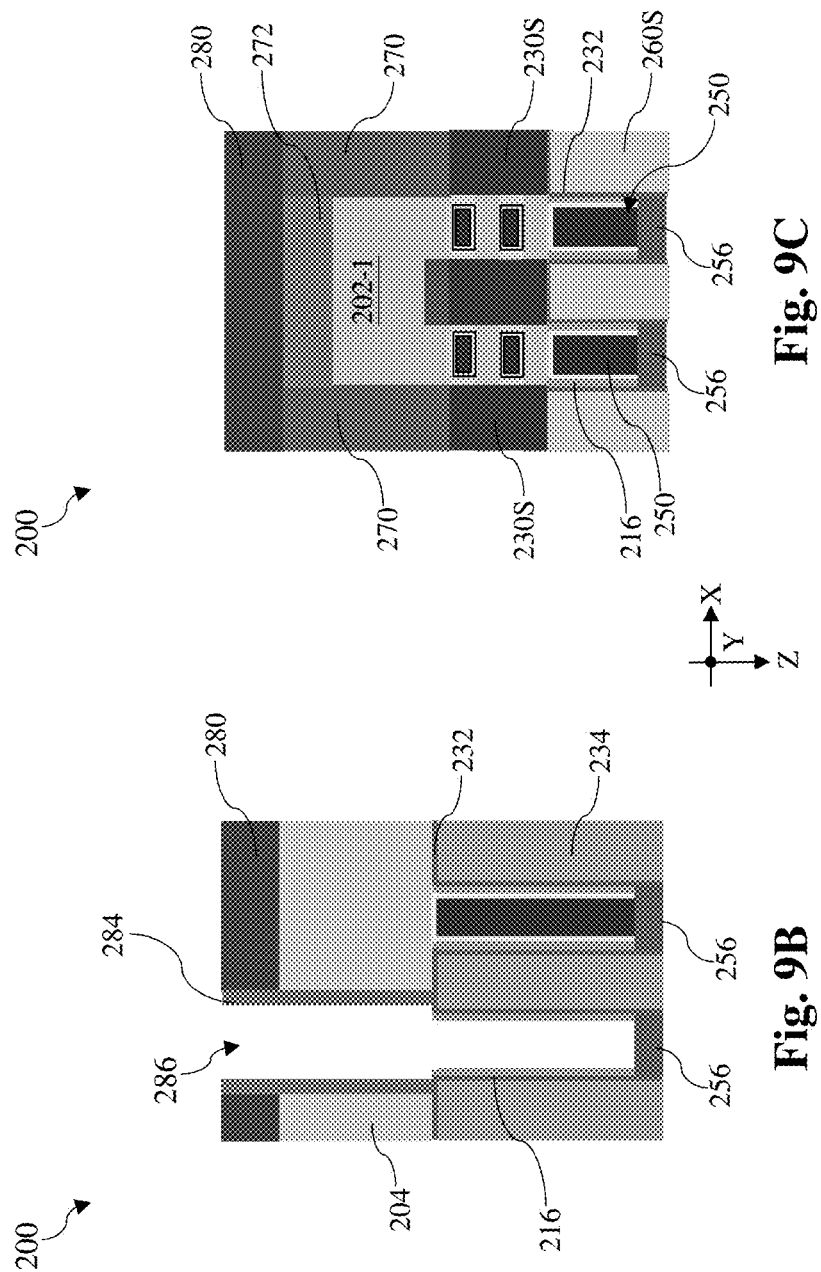

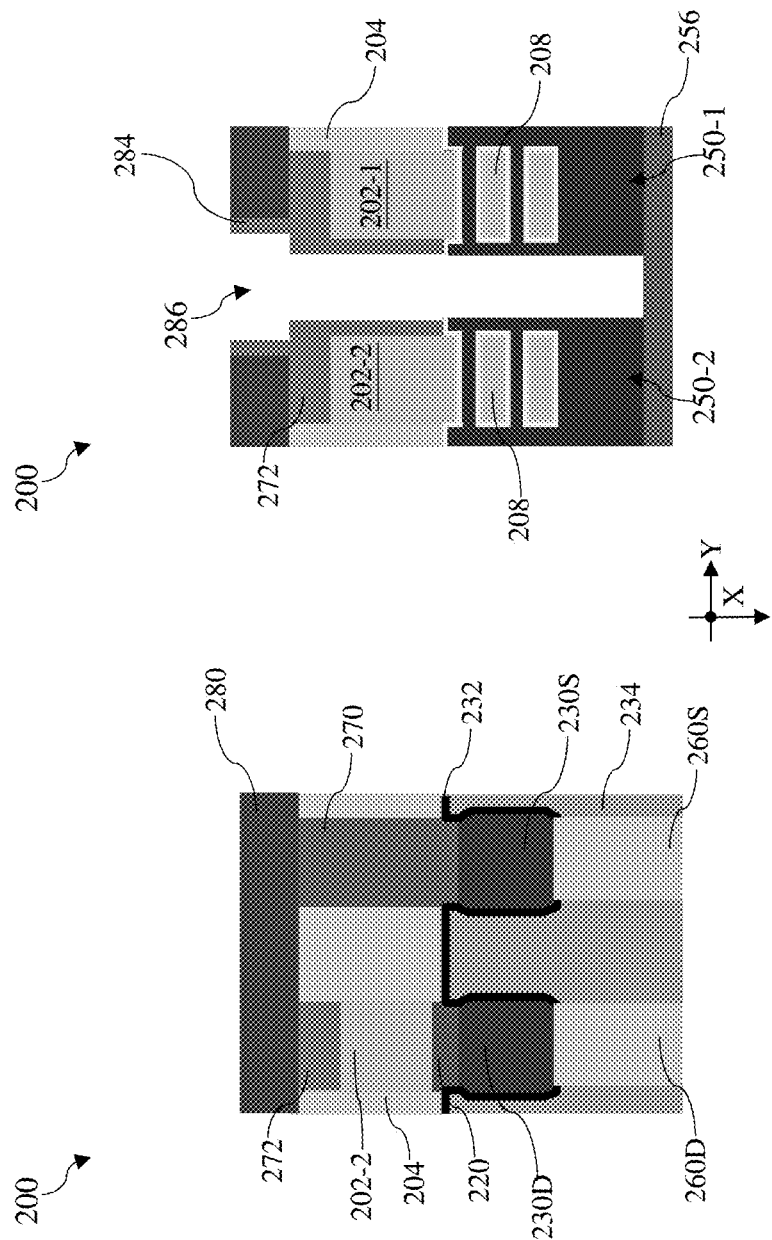

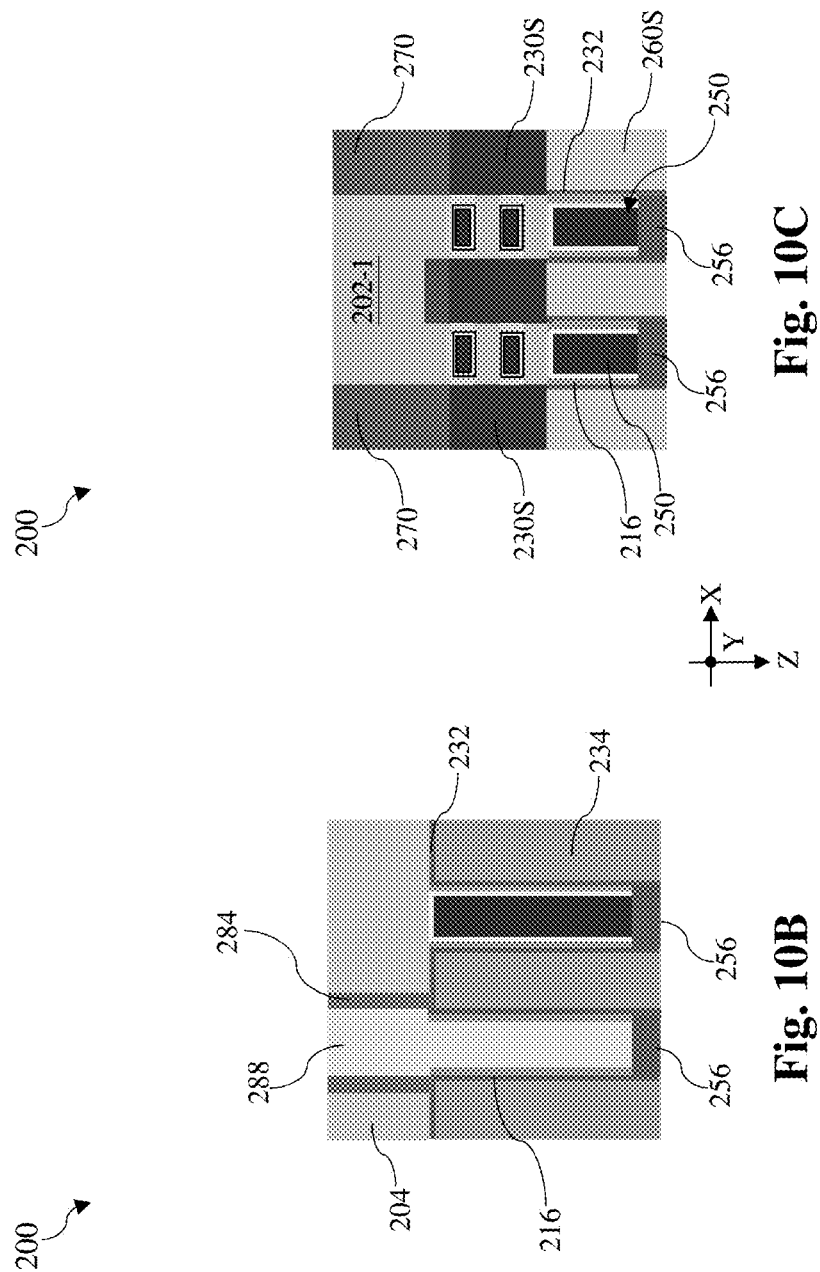

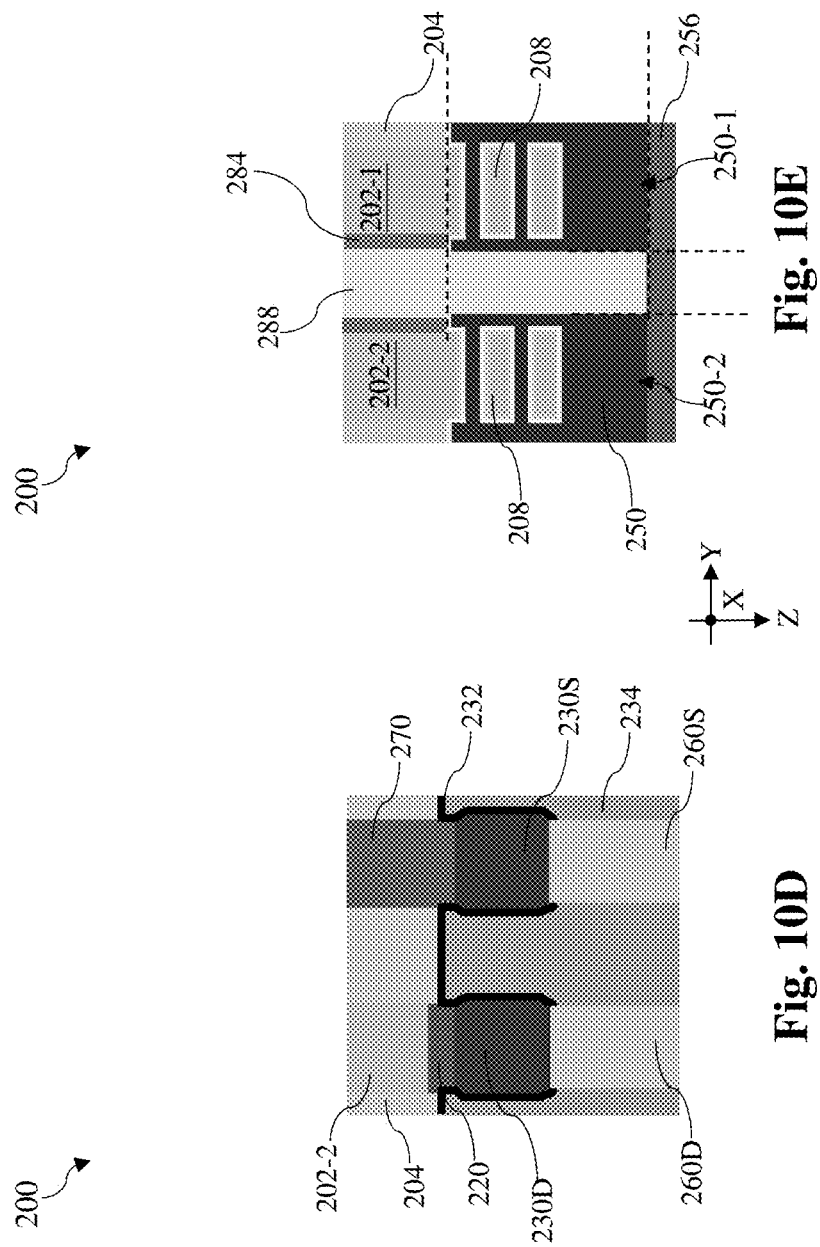

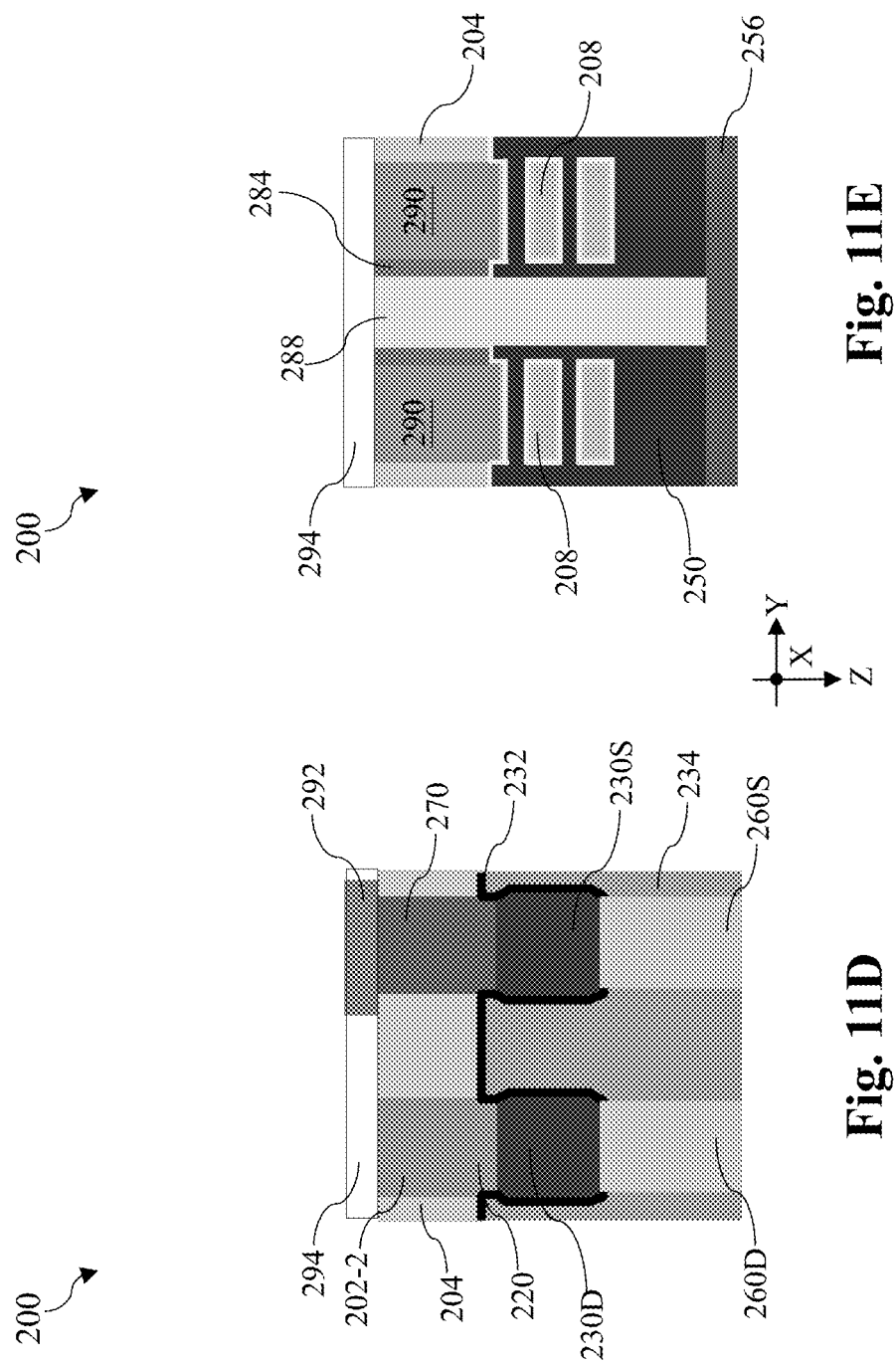

GATE CUT STRUCTURE AND METHOD OF FORMING THE SAME

PRIORITY DATA

This application claims priority to U.S. Provisional Patent Application No. 63/105,502, filed on Oct. 26, 2020, entitled "Gate Cut Structure and Method of Forming the Same" the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As integrated circuit (IC) technologies progress towards smaller technology nodes, it is more and more difficult to ensure satisfactory mask overlay. For example, some gate cut features include a top portion and a bottom portion that are formed in sequence using lithography and etch processes. When the mask alignment is less than ideal, the top portion may not land on the bottom portion. Therefore, while existing gate cut features and formation processes thereof are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-11A, 2B-11B, 2C-11C, 2D-11D, and 2E-11E illustrate fragmentary cross-sectional views of a workpiece during a fabrication process according to the method of FIG. 1, according to one or more aspects of the present disclosure.

DETAILED DESCRIPTION

Figure 1:
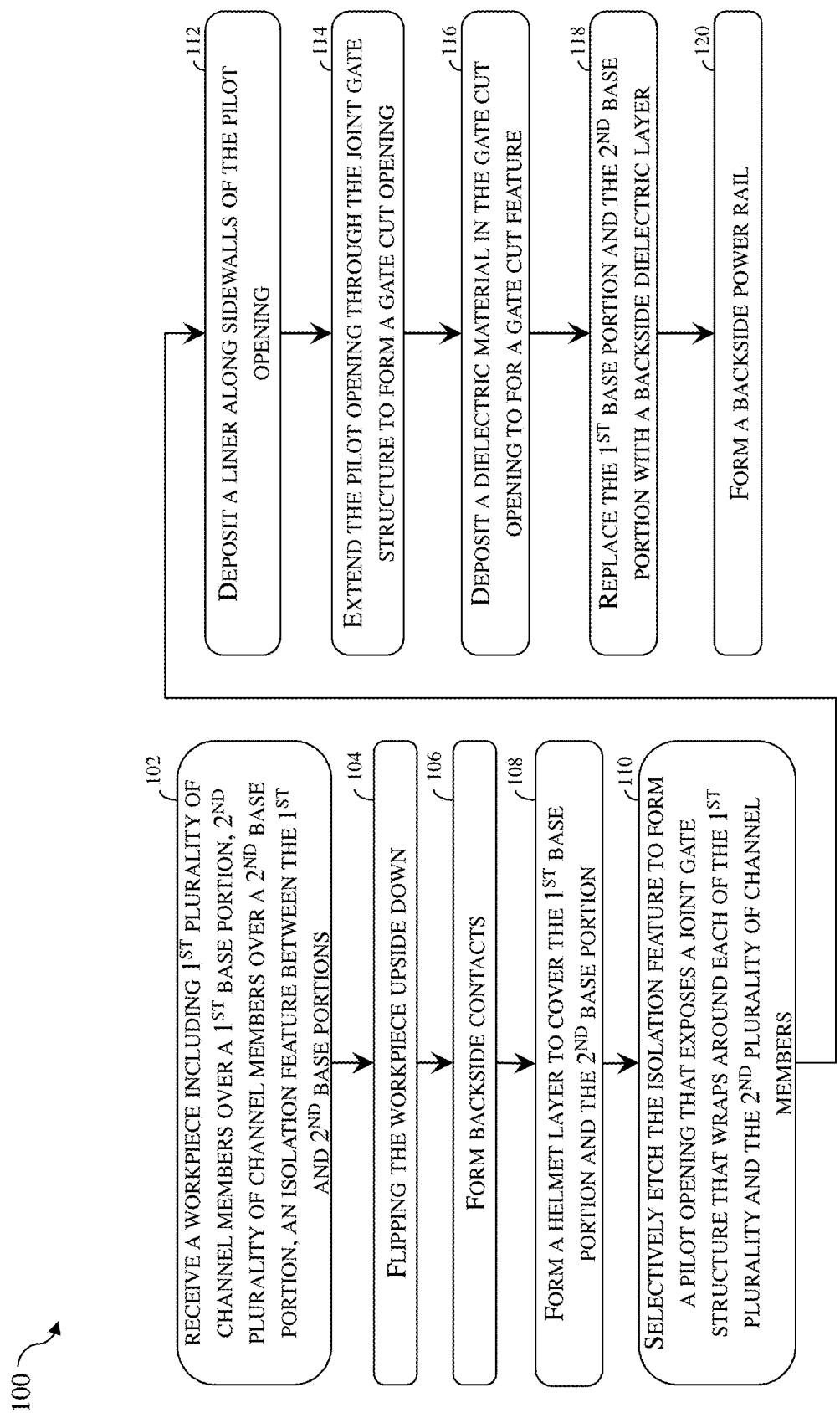
FIG. 1 illustrates a flow chart of a method for forming a semiconductor device having a backside contact, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In semiconductor fabrication, cut metal gate (CMG) process refers to a process for forming a dielectric feature to divides a continuous gate structure that spans over more than one active region into more than one segment. Such a dielectric feature may be referred to as a gate cut feature or a cut feature. In some existing CMG processes, a gate cut feature is formed on a dielectric fin (or a hybrid fin). With the gate cut feature on top and the dielectric fin on bottom, they work in synergy to separate a gate structure into two segments. In some example processes, the gate cut feature is formed using photolithography and etch processes from a front side of a substrate (such as a wafer). As the scaling down of semiconductor device continues, it becomes increasingly difficult to form the gate cut feature squarely on a dielectric fin due to overlay and critical dimension uniformity (CDU) limitations. In some instances, the gate cut feature that misses the dielectric fin may cut into the gate structure or the channel region, resulting in defects.

The present disclosure provides CMG processes that, unlike existing technologies, forms a cut feature from a back side of the substrate. Additionally, the cut feature of the according to the present disclosure extends from the back side of the substrate through the gate structure. That is, the cut feature of the present disclosure alone divides the gate structure into segments without help from a dielectric fin or a hybrid fin. In some instances, the cut feature of the present disclosure may even extend horizontally through more than one gate structures or extend vertically through one or more dielectric features or layers over the gate structure. Processes of the present disclosure are not only formed from the back side but are also self-aligned to avoid defects associated with mask misalignment. Embodiments of the present disclosure may continue the scaling down of cell heights while maintaining or increasing the process window.

The various aspects of the present disclosure will now be described in more detail with reference to the figures. In that regard, FIG. 1 is a flowchart illustrating method 100 of forming a semiconductor device according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2A-11A, 2B-11B, 2C-11C, 2D-11D, and 2E-11E, which are fragmentary cross-sectional views of a workpiece 200 at different stages of fabrication according to embodiments of method 100. Among FIGS. 2A-11A, 2B-11B, 2C-11C, 2D-11D, and 2E-11E, figures ending with A are perspectives of the workpiece 200; figures ending with B are fragmentary cross-sectional views along cross-section B-B' in the respective perspective view; figures ending with C are fragmentary cross-sectional views along cross-section C-C' in the respective perspective view; figures ending with D are fragmentary cross-sectional views along cross-section D-D' in the respective perspective view; and figures ending with E are fragmentary cross-sectional views along cross-section E-E' in the respective perspective view. Because the workpiece 200 will be fabricated into a semiconductor device 200 upon conclusion of the fabrication processes, the workpiece 200 may be referred to as the semiconductor device 200 as the context requires. Additionally, throughout the present application, like reference numerals denote like features, unless otherwise excepted.

Embodiments of the present disclosure may be implemented to advanced semiconductor devices that may include multi-gate devices. A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. Embodiments of the present disclosure are described using an MBC transistor structure, which is for illustration purpose only and should not be construed as limiting the scope of the present disclosure.

Figure 2A:
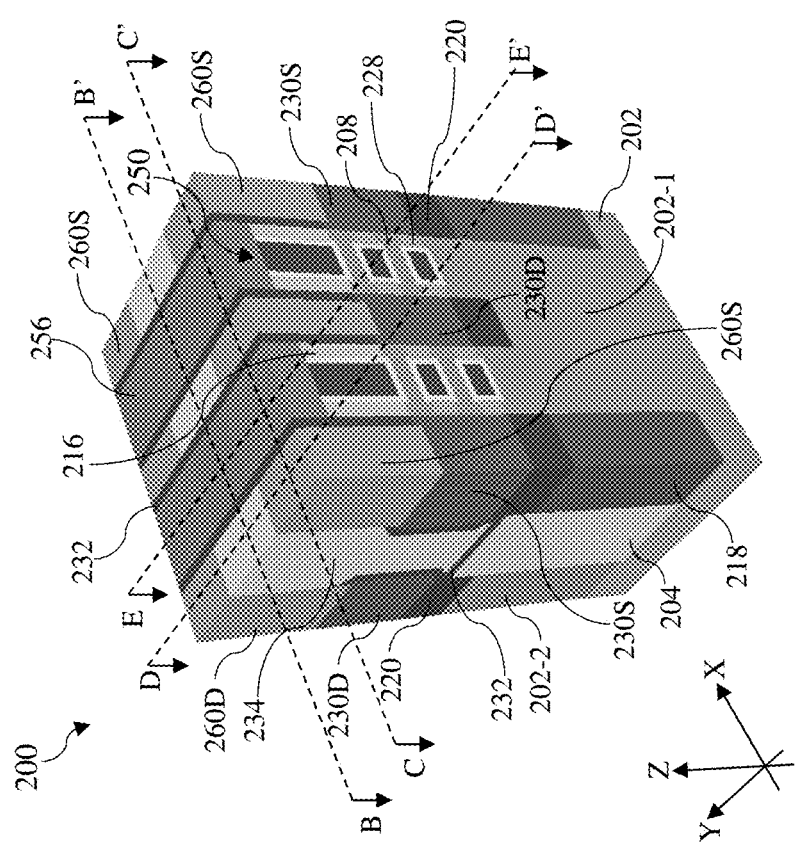
Figure 3A:
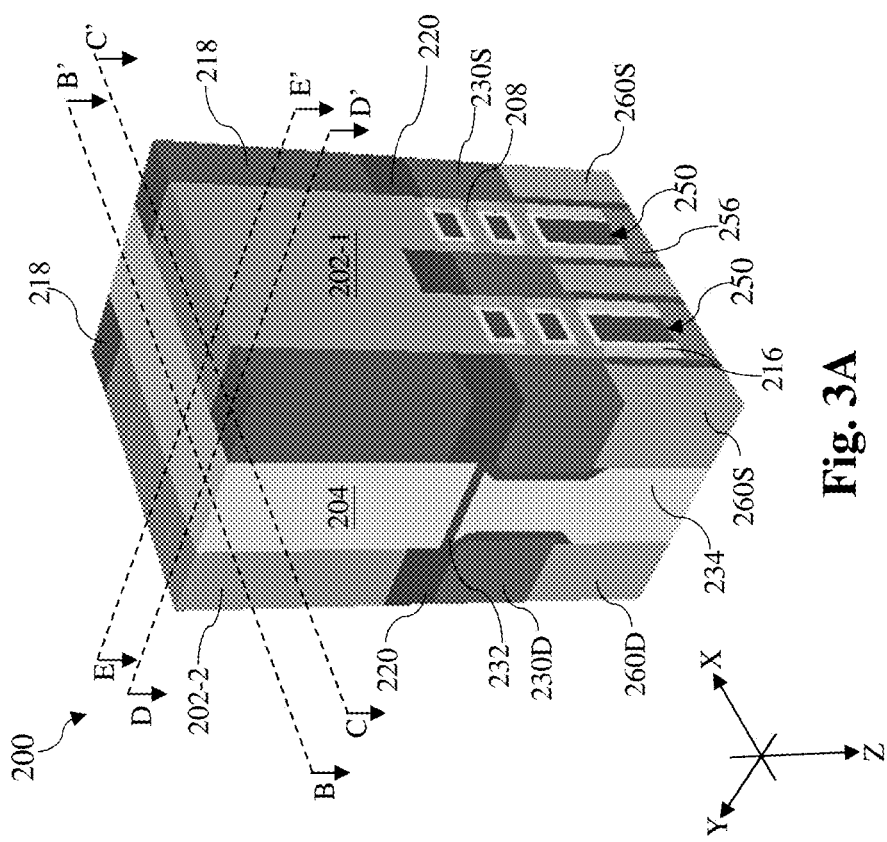
Figure 3C:
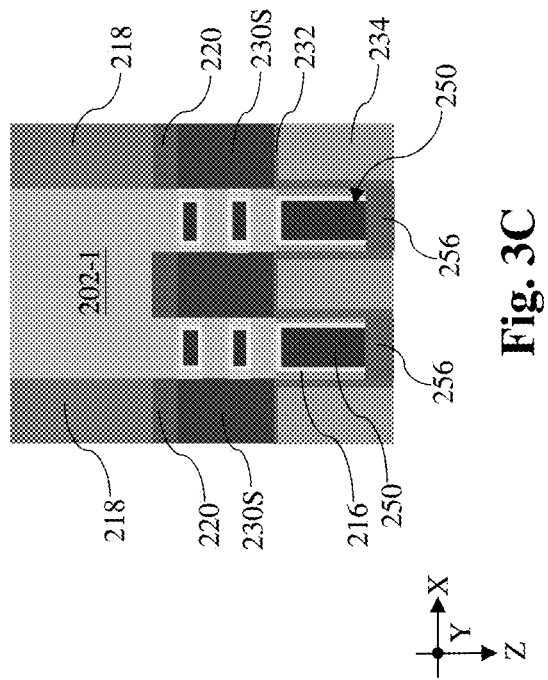
Figure 3B:
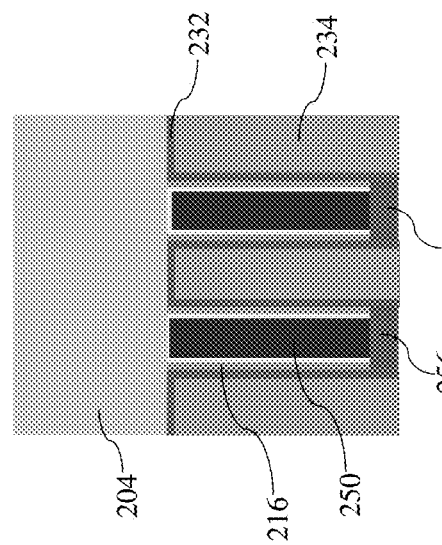

Referring to FIGS. 1 and 2A-2E, method 100 includes a block 102 where a workpiece 200 is received. FIGS. 2A-2E illustrate a workpiece 200 with its front side facing up. That is, no backside processes have been yet performed to the workpiece 200 shown in FIGS. 2A-2E. The workpiece 200 includes a substrate 202. In one embodiment, the substrate 202 includes silicon (Si). In other embodiments, the substrate 202 may also include other semiconductor materials such as germanium (Ge), silicon carbide (SiC), silicon germanium (SiGe), or diamond. The workpiece 200 includes a first base portion 202-1 and a second base portion 202-2, each of which is patterned from the substrate 202 and may share the same composition as the substrate 202. While the substrate 202 is shown in FIGS. 2A-2E, it may be omitted from at least some of the other figures for simplicity. Referring to FIG. 2E, the first base portion 202-1 and the second base portion 202-2 are spaced apart from one another by an isolation feature 204. In some embodiments, the isolation feature 204 is deposited in trenches that define the substrate 202. The isolation feature 204 may also be referred to as a shallow trench isolation (STI) feature 204. The isolation feature 204 may include silicon oxide, silicon oxynitride, fluorine-doped silicate glass (FSG), a low-k dielectric, combinations thereof, and/or other suitable materials.

Referring to FIG. 2E, the workpiece 200 includes a plurality of vertically stacked channel members 208 over the first base portion 202-1 and another plurality of vertically stacked channel members 208 over the second base portion 202-2. In the depicted embodiments, two vertically stacked channel members 208 are disposed over each of the first base portion 202-1 and the second base portion 202-2, as shown in FIG. 2C. The channel members 208 may be formed of a semiconductor material that is similar to the material of the substrate 202. In one embodiments, the channel members 208 may include silicon (Si). Channel members 208 over the first base portion 202-1 and the second base portion 202-2 are wrapped around by a joint gate structure 250 that extends along the Y direction. Each of the joint gate structures 250 may include an interfacial layer 252, a gate dielectric layer 254 over the interfacial layer 252 and a gate electrode layer over the gate dielectric layer 254. In some embodiments, the interfacial layer 252 includes silicon oxide. The gate dielectric layer 254 may also be referred to a high-k dielectric layer, as it is formed of a dielectric material having a dielectric constant greater than that of silicon dioxide, which is about 3.9. The gate dielectric layer 254 may include hafnium oxide. Alternatively, the gate dielectric layer 254 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

The gate electrode layer may include a single layer or alternatively a multi-layer structure, such as various combinations of a metal layer with a selected work function to enhance the device performance (work function metal layer), a liner layer, a wetting layer, an first adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

Referring to FIGS. 2A-2C, the workpiece 200 includes a gate spacer 216 disposed along sidewalls of the joint gate structures 250 above the topmost channel member 208 or above the isolation feature 204. The gate spacer 216 may be a single layer or a multilayer. In some embodiments, the gate spacer 216 may include silicon oxide, silicon nitride, silicon carbide, silicon oxynitride, silicon carbonitride, silicon oxycarbide, silicon oxycarbonitride, and/or combinations thereof. Between two adjacent channel members 208, sidewalls of the gate structures are lined by inner spacer features 228. The inner spacer features 228 may include silicon oxide, silicon nitride, silicon oxycarbide, silicon oxycarbonitride, silicon carbonitride, metal nitride, or a suitable dielectric material. With respect to each of the first base portion 202-1 and the second base portion 202-2, each vertical stack of channel members extend between a source feature 230S and a drain feature 230D. One end surface of each of the channel members 208 is coupled to a source feature 230S and the other end surface of each of the channel members 208 is coupled to a drain feature 230D. Depending on the conductivity type of the to-be-formed MBC transistor, the source feature 230S and the drain feature 230D may be n-type or p-type. When they are n-type, they may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb). When they are p-type, they may include germanium (Ge), gallium-doped silicon germanium (SiGe: Ga), boron-doped silicon germanium (SiGe:B), or other suitable material and may be in-situ doped during the epitaxial process by introducing a p-type dopant, such as boron (B) or gallium (Ga).

Reference is made to FIGS. 2A, 2C and 2D. Each of the source feature 230S and the drain feature 230D includes a first epitaxial layer 220 and a second epitaxial layer 222 over the first epitaxial layer 220. In some implementations, the first epitaxial layer 220 and the second epitaxial layer 222 have different doping concentrations. For example, the doping concentration in the second epitaxial layer 222 is greater than a doping concentration of the first epitaxial layer 220. The increased doping concentration in the second epitaxial layer 222 functions to reduce contact resistance. The workpiece 200 also includes a contact etch stop layer (CESL) 232 disposed over the source feature 230S and the drain feature 230D and an interlayer dielectric (ILD) layer 234 disposed over the CESL 232. The CESL 232 may include silicon nitride, silicon oxynitride, and/or other materials known in the art. The ILD layer 234 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

As shown in FIGS. 2A, 2C and 2D, at least one of the source features 230S is disposed directly over a semiconductor plug 218. The semiconductor plug 218 extends through the substrate 202 as well as the isolation feature 204 Along the X direction, the semiconductor plug 218 is sandwiched between two base portions. Along the Y direction, the semiconductor plug 218 is sandwiched between two portions of the isolation feature 204. In some embodiments, the semiconductor plug 218 may be formed of silicon germanium (SiGe) that is not doped. In some embodiments, composition of the semiconductor plug 218 and the first epitaxial layer 220 are selected such that the first epitaxial layer 220 may serve as an epitaxial etch stop layer. For example, when an n-type MBC transistor is desired, the first epitaxial layer 220 is formed of silicon (Si) doped with an n-type dopant. An etch process that etches the semiconductor plug 218 (formed of silicon germanium) may be slowed down when it etches the first epitaxial layer 220 due to the reduction of germanium content. When a p-type MBC transistor is desired, the first epitaxial layer 220 is formed of silicon germanium fSiGe) doped with boron (B). An etch process that etches the semiconductor plug 218 (formed of silicon germanium) may be slowed down when it etches the first epitaxial layer 220 as the boron dopant may reduce the etch rate.

In some embodiments represented in FIGS. 2A, 2B, 2C, and 2E, a gate self-aligned contact (SAC) dielectric layer 256 is formed. In some instances, the gate SAC dielectric layer 256 may be disposed over the joint gate structure 250 and the gate spacer 216. The gate SAC dielectric layer 256 may be a single layer or a multi-layer and may include silicon oxide, silicon nitride, silicon carbide, silicon oxynitride, silicon carbonitride, silicon oxycarbide, silicon oxycarbonitride, and/or combinations thereof. The workpiece 200 may also include frontside source contacts 260S over source features 230S and frontside drain contacts 260D over drain features. The frontside source contacts 260S or the frontside drain contacts 260D may include titanium nitride (TiN), tantalum (Ta), titanium (Ti), tantalum nitride (TaN), ruthenium (Ru), tungsten (W), cobalt (Co), aluminum (Al), molybdenum (Mo), titanium silicide (TiSi), tungsten silicon (WSi), platinum silicide (PtSi), cobalt silicide (CoSi), nickel silicide (NiSi), or a combination thereof.

At block 102, the workpiece 200 may be received with its front side facing up as shown in FIGS. 2A-2E. In this configuration, the substrate 202 is on the bottom and the gate SAC dielectric layer 256 is on the top.

Referring to FIGS. 1 and 3A-3E, method 100 includes a block 104 where the workpiece 200 is flipped upside down. To flip the workpiece 200 up-side-down, a carrier substrate (not explicitly shown) is bonded to a front side of the workpiece 200 away from the substrate 202. In some embodiments, the carrier substrate may be bonded to the workpiece 200 by fusion bonding, by use of an adhesion layer, or a combination thereof. In some instances, the carrier substrate may be formed of semiconductor materials (such as silicon), sapphire, glass, polymeric materials, or other suitable materials. In embodiments where fusion bonding is used, the carrier substrate includes a bottom oxide layer and the workpiece 200 includes a top oxide layer. After both the bottom oxide layer and top oxide layer are treated, they are placed in plush contact with one another for direct bonding at room temperature or at an elevated temperature. Once the carrier substrate is bonded to the workpiece 200, the workpiece 200 is flipped over, as shown in FIGS. 3A-3E. After the workpiece 200 is flipped over, the back side of the workpiece 200 is planarized using chemical mechanical polishing (CMP) until the isolation feature 204, the semiconductor plugs 218, the first base portion 202-1, and the second base portion 202-2 are exposed on the back side of the workpiece 200, which is now facing up.

Referring to FIGS. 1 and 4A-4E, method 100 includes a block 106 where the backside contacts 270 are formed. Operations at block 106 may include selective removal of the semiconductor plugs 218 to form backside contact openings and formation of the backside contacts 270 in the backside openings. In some embodiments, the removal of the semiconductor plug 218 may be self-aligned because the semiconductor plug 218, which is formed of silicon germanium (SiGe), is disposed among the isolation feature 204 (formed of a dielectric material), the first base portion 202-1 (formed of silicon (Si) in at least some embodiments) and the second base portion 202-2 (formed of silicon (Si) in at least some embodiments). In these embodiments, the selective removal of the semiconductor plug 218 may be performed using a selective wet etch process. An example selective wet etch process may include use of a solution of ammonium hydroxide ($NH_4OH$) and hydrogen peroxide ($H_2O_2$). Because the selective etch process at block 106 etches the semiconductor plug 218 faster than it etches the isolation feature 204, the first base portion 202-1 and the second base portion 202-2, the semiconductor plug 218 may be removed without little or no damages to them. In the depicted embodiments, the selective removal of the semiconductor plug 218 may also remove a portion of the first epitaxial layer 220 under the semiconductor plug 218. The removal of the semiconductor plug 218 and the first epitaxial layer 220 forms backside contact openings to expose the source features 230S.

The backside contacts 270 are then formed in the backside contact openings. Although not explicitly shown, each of the backside contacts 270 may include a silicide layer to interface the source feature 230S and a metal fill layer. In an example process, a metal precursor is then deposited over the exposed source features 230S and an anneal process is performed to bring about silicidation between the source feature 230S and the metal precursor to form the silicide layer. In some embodiments, the metal precursor may include titanium (Ti), chromium (Cr), tantalum (Ta), molybdenum (Mo), zirconium (Zr), nickel (Ni), cobalt (Co), manganese (Mn), tungsten (W), iron (Fe), ruthenium (Ru), or platinum (Pt) and the silicide layer may include titanium silicide (TiSi), chromium silicide (CrSi), tantalum silicide (TaSi), molybdenum silicide (MoSi), nickel silicide (NiSi), cobalt silicide (CoSi), manganese silicide (MnSi), tungsten silicide (WSi), iron silicide (FeSi), ruthenium silicide (RuSi), or platinum silicide (PtSi). After the formation of the silicide layer, a metal fill material may be deposited into the backside contact openings to form the backside contacts 270, as shown in FIGS. 4A-4E. The metal fill material may include tungsten (W), ruthenium (Ru), cobalt (Co), titanium (Ti), titanium nitride (TiN), tantalum (Ta), tantalum nitride (TaN), molybdenum (Mo), or aluminum (Al) and may be deposited using physical vapor deposition (PVD) or chemical vapor deposition (CVD). In some embodiments, the backside contacts 270 may optionally include a barrier layer disposed at its interface with the isolation feature 204. The optional barrier layer may include titanium nitride (TiN), tantalum nitride (TaN), cobalt nitride (CoN), nickel nitride (NiN), tungsten nitride (WN), titanium (Ti), or tantalum (Ta). A planarization process, such as a CMP process, may follow the deposition of the metal fill material to remove excess materials and provide a planar top surface. Upon conclusion of the operations at block 106, the backside contacts 270 are coupled to the source features 230S.

Figure 4A:
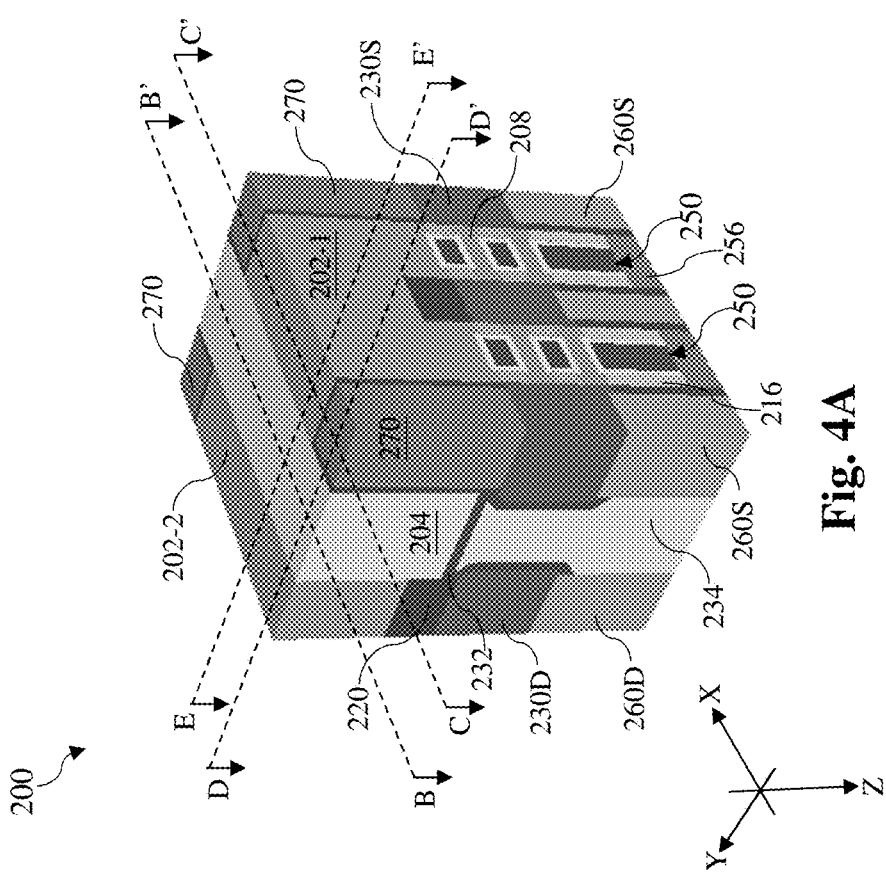
Figures 4B, 4C:
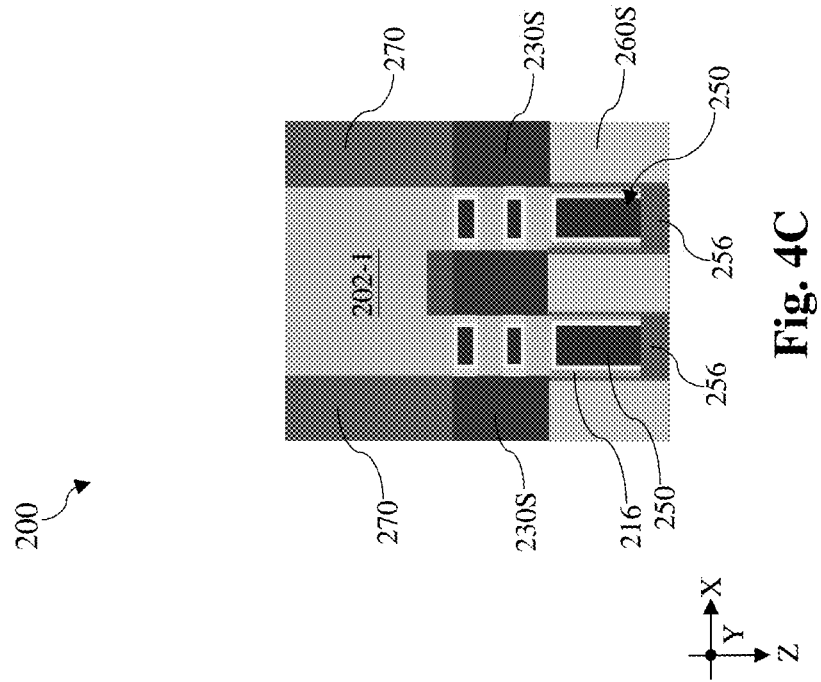
Figure 5A:
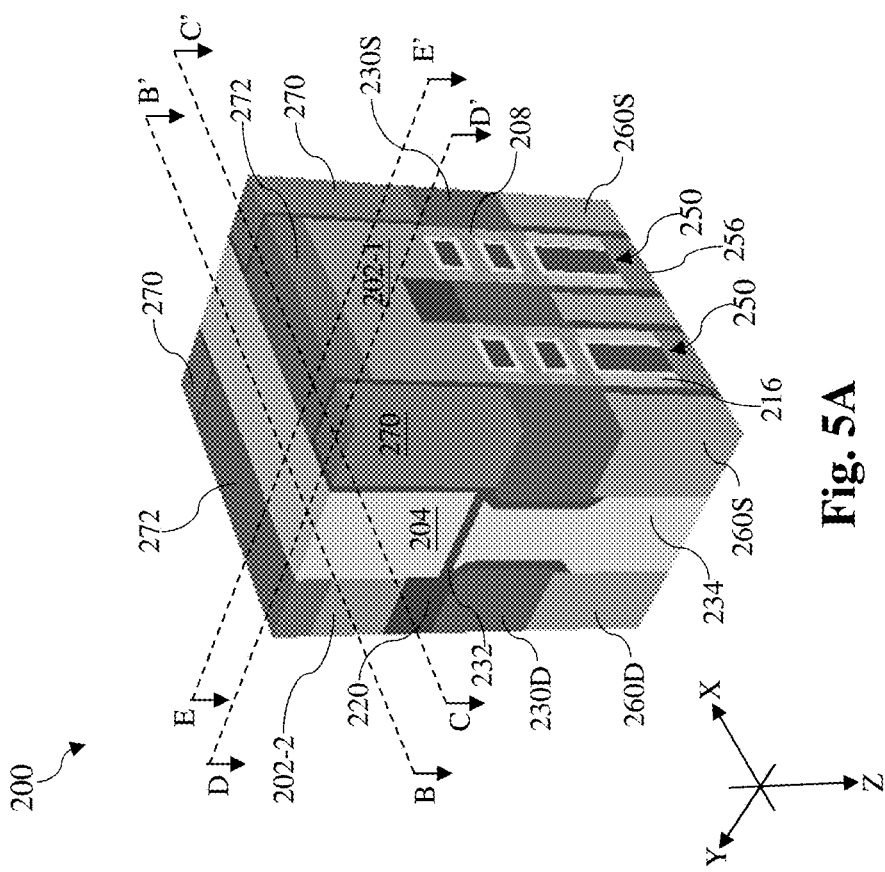

Referring to FIGS. 1 and 5A-5E, method 100 includes a block 108 where a helmet layer 272 is formed to cover the first base portion 202-1 and the second base portion 202-2. In some embodiments, operations at block 108 include selective recessing the first base portion 202-1 and the second base portion 202-2 to form recesses and formation of the helmet layer 272 in the recesses. As shown in FIG. 4A, upon conclusion of the operations at block 106, the first base portion 202-1 and the second base portion 202-2 are surrounded by the isolation feature 204 and the backside contacts 270, which are formed of different materials. In some implementations, the selective recessing of the first base portion 202-1 and the second base portion 202-2 may be performed using a selective wet etch process or a selective dry etch process. An example selective wet etch process may include use of ethylenediamine pyrocatechol (EDP), tetramethylammonium hydroxide (TMAH), nitric acid (HNO3), hydrofluoric acid (HF), ammonia (NH3), ammonium fluoride (NH4F) or a suitable wet etchant. An example selective dry etch process may include sulfur hexafluoride (SF6), hydrogen (H2), ammonia (NH3), hydrogen fluoride (HF), carbon tetrafluoride (CF4), argon, or a mixture thereof. After the first base portion 202-1 and the second base portion 202-2 are recessed to form recesses, a metal or a metal oxide may be deposited in the recesses to form the helmet layer 272. In some embodiments, the helmet layer 272 may include aluminum oxide, hafnium oxide, zirconium oxide, titanium oxide, zinc oxide, cobalt (Co), titanium (Ti), tantalum (Ta), ruthenium (Ru), or tungsten (W). In one embodiment, the helmet layer 272 includes hafnium oxide. A planarization process is then performed to provide a planar backside surface. As shown in FIGS. 5A, 5C, 5D, and 5E, the helmet layer 272 may abut one or more backside contacts 270 and the isolation feature 204.

Figure 6A:
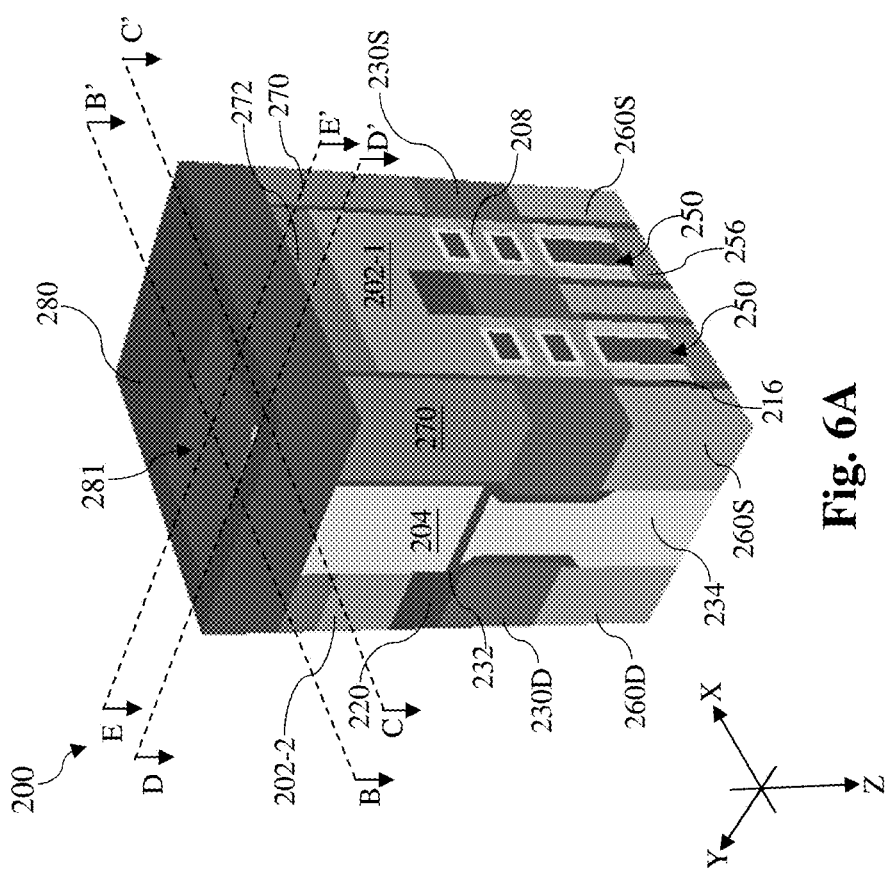

Referring to FIGS. 1, 6A-6E and 7A-7E, method 100 includes a block 110 where the isolation feature 204 is selectively etched to form a pilot opening 282 that exposes the joint gate structure 250. Operations at block 110 include formation of a patterned hard mask 280 (shown in FIGS. 6A-6E) and formation of the pilot opening 282 (shown in FIGS. 7A-7E). In an example process, a hard mask layer is blanketly deposited over the workpiece 200 using CVD. The hard mask layer may be a single layer or a multi-layer. When the hard mask layer is a multi-layer, the hard mask layer may include a silicon oxide layer and silicon nitride layer. After a deposition of the hard mask layer, photolithography and etch processes may be performed to pattern the hard mask layer to form the patterned hard mask. In some instances, a photoresist layer is deposited over the hard mask layer. To pattern the photoresist layer, the photoresist layer is exposed to radiation reflected from or transmitting through a photomask, baked in a post-exposure bake process, and developed in a developer. The patterned photoresist layer is then applied as an etch mask to etch the hard mask layer, thereby forming the patterned hard mask 280. Referring to FIGS. 6A-6E, the patterned hard mask 280 includes a mask opening 281 that is substantially aligned with the to-be-formed pilot opening 282. According to the present disclosure, the patterned hard mask 280 functions to mask portions of the isolation feature 204 that are not to be etched at block 114. It does not matter if a portion of the helmet layer 272 is exposed in the mask opening 281. As shown in FIG. 6E, the mask opening 281 may not be coterminous with portions of the helmet layer 272 on the first base portion 202-1 and the second base portion 202-2. This is so because the etch process at block 114 is selective to the isolation feature 204 and does not substantially etch the helmet layer 272. Even when the mask opening 281 is larger than the pilot opening 282 or is misaligned as shown by the dotted lines in FIG. 6E, the pilot opening 282 may still be successfully formed.

Figure 7A:
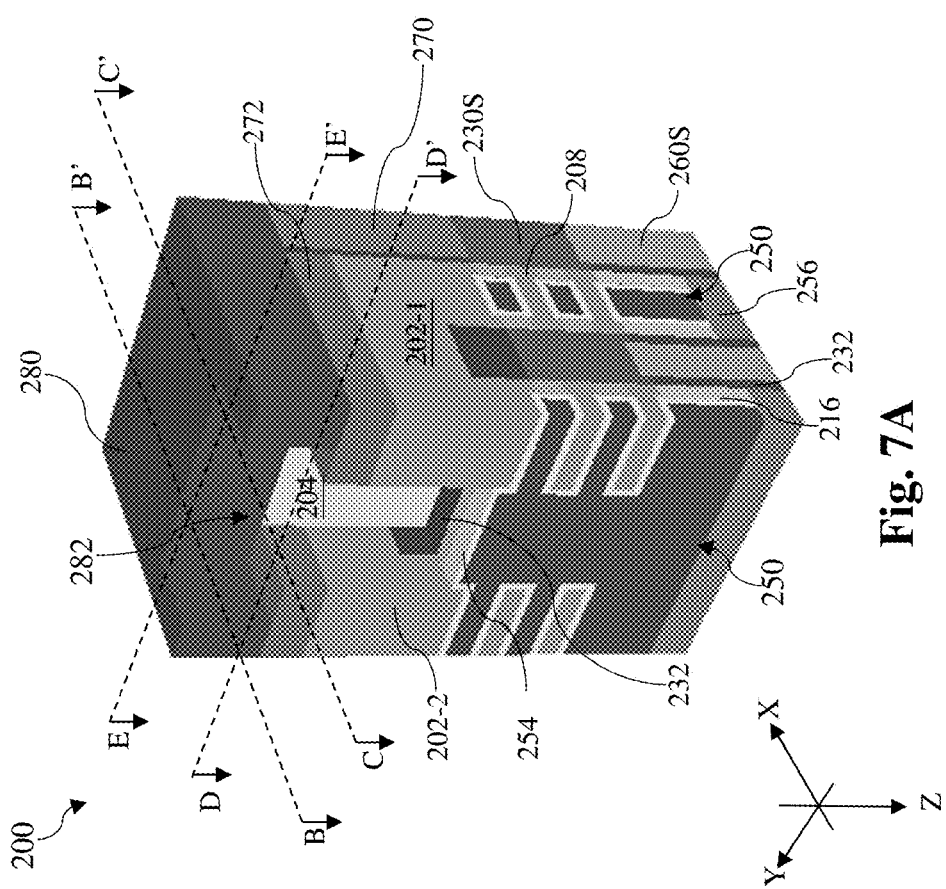

Reference is then made to FIGS. 7A and 7E. With the patterned hard mask 280 in place, the isolation feature 204 is selectively and anisotropically etched to form the pilot opening 282. In some embodiments, the isolation feature 204 may be etched using a dry etch process (e.g., a reactive-ion etching (RIE)) that uses chlorine ($Cl_2$), oxygen ($O_2$), boron trifluoride ($BCl_3$), carbon tetrafluoride ($CF_4$), or a combination thereof. As shown in FIG. 7A, the pilot opening 282 may terminate on top-facing surfaces of the gate dielectric layer 254, the gate spacer 216, and the CESL 232, without extending into the gate electrode layer of the joint gate structure 250. Because the mask opening 281 is not coterminous with the spacing of the helmet layer 272, a width of the pilot opening 282 between the first base portion 202-1 and the second base portion 202-2 is smaller than a width of the mask opening 281 along the X direction. It is noted that, to better illustrate the pilot opening 282, the structures that intersect the cross-section D-D' are omitted from FIG. 7A. FIG. 7D illustrates the structures along the cross-section D-D'.

Figure 8A:
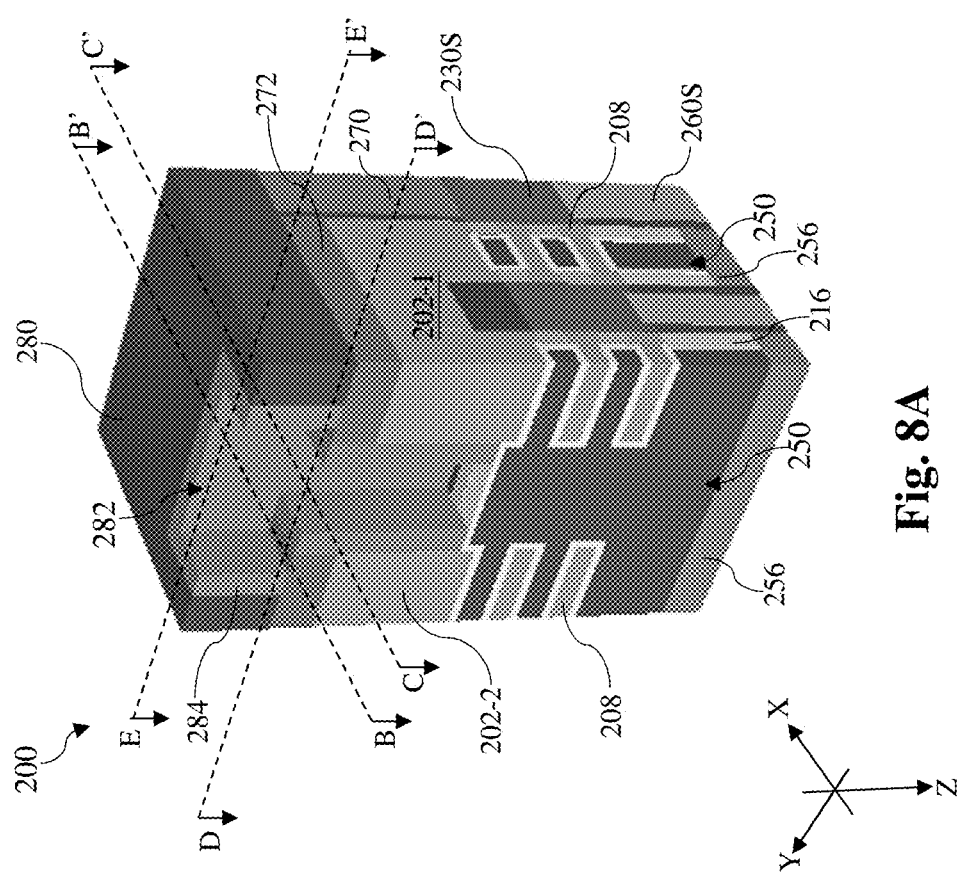

Referring to FIGS. 1 and 8A-8E, method 100 includes a block 112 where a liner 284 is deposited along sidewalls of the pilot opening 282. The liner 284 functions to protect the first base portion 202-1 and the second base portion 202-2 from the etch process at block 114. The liner 284 may also be referred to as a cut metal gate end cap layer. The liner 284 may be a single layer or a multi-layer. In an example process, at least one dielectric material is deposited over the back side of the workpiece 200 and then the deposited dielectric material is anisotropically etched back to expose the gate dielectric layer 254, as shown in FIGS. 8A, 8B, and 8E. In some instances, the at least one dielectric material for the liner 284 may include silicon, oxygen, nitrogen, or carbon. For example, the at least one dielectric material may include silicon nitride, silicon carbonitride, silicon oxycarbonitride, silicon oxycarbide, or silicon oxynitride. After the etch back process, the liner 284 may have a thickness between about 6 nm and about 10 nm. It is noted that, to better illustrate the liner 284, the structures that intersect the cross-section D-D' are omitted from FIG. 8A. FIG. 8D illustrates the structures along the cross-section D-D'.

Figure 9A:
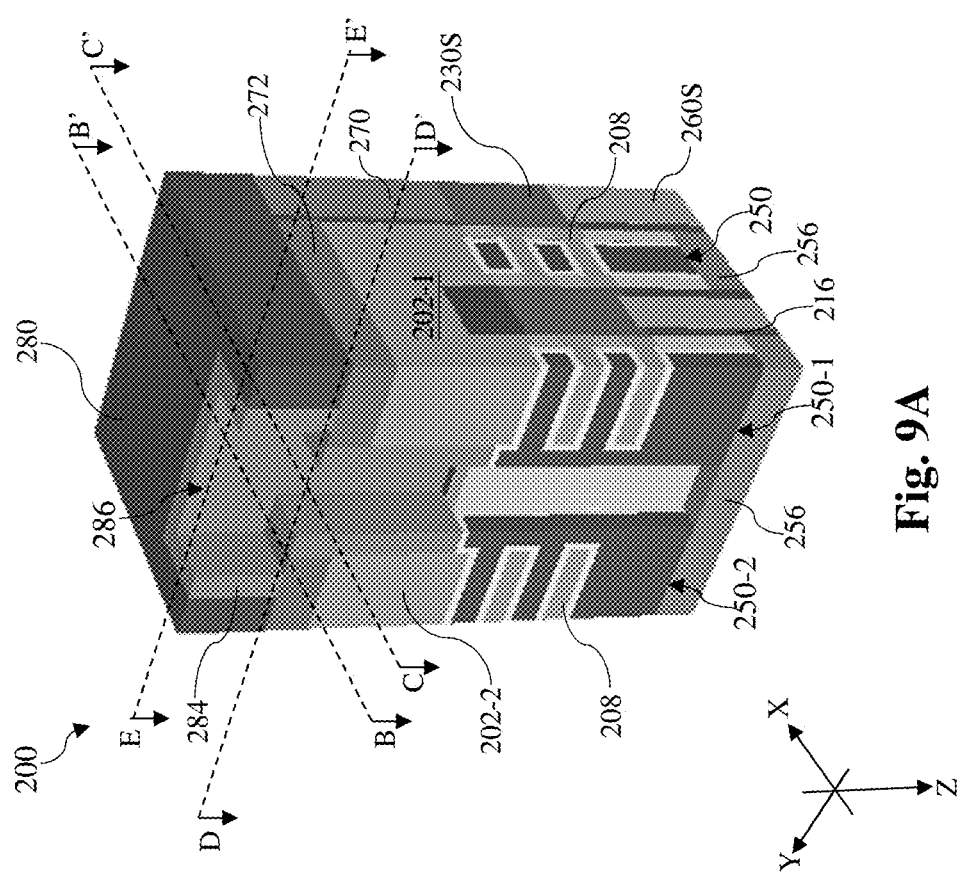

Referring to FIGS. 1 and 9A-9E, method 100 includes a block 114 where the pilot opening 282 is extended through the joint gate structure 250 to form a gate cut opening 286. At block 114, an anisotropic etch process is performed to extend the pilot opening 282 to form the gate cut opening 286. In some embodiments, the gate cut opening 286 terminates on or in the gate SAC dielectric layer 256. As shown in FIGS. 9A, 9B and 9E, because the anisotropic etch process etches the liner 284, the gate spacer 216, and the gate SAC dielectric layer 256 at a slower rate, these structures confine the etch process at block 114 and define the boundaries of the gate cut opening 286. In some implementations, the anisotropic etch process at block 114 may be a dry etch process (e.g., a reactive-ion etching (RIE)) that uses chlorine ($Cl_2$), oxygen ($O_2$), boron trifluoride ($BCl_3$), carbon tetrafluoride ($CF_4$), or a combination thereof. It is noted that, to better illustrate the features in the gate cut opening 286, the structures that intersect the cross-section D-D' are omitted from FIG. 9A. FIG. 9D illustrates the structures along the cross-section D-D'. As shown in FIGS. 9A and 9E, the gate cut opening 286 separate the joint gate structure 250 into a first gate segment 250-1 and a second gate segment 250-2.

Figure 10A:
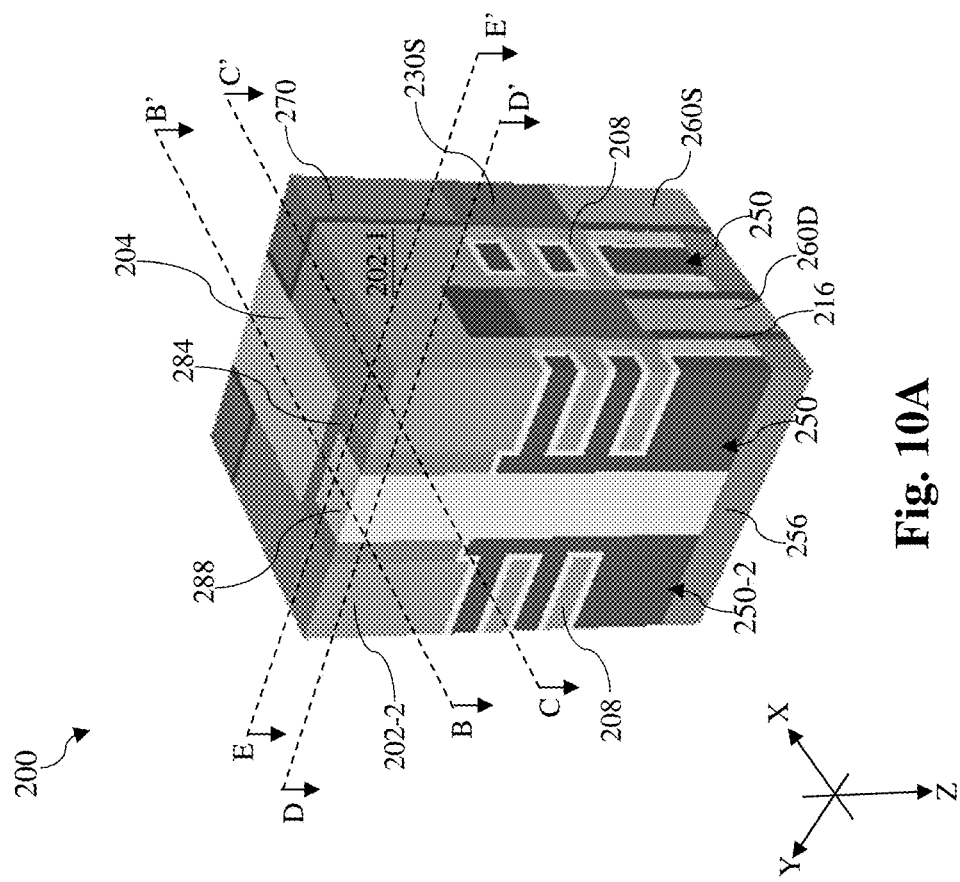

Referring to FIGS. 1 and 10A-10E, method 100 includes a block 116 where a dielectric material is deposited in the gate cut opening 286 to form a gate cut feature 288. In some embodiments, the dielectric material for the gate cut feature 288 may be deposited using plasma-enhanced CVD (PECVD), high-density-plasma CVD (HDPCVD), or CVD. In some instances, the dielectric material for the gate cut feature 288 may include silicon nitride, silicon carbonitride, silicon oxycarbonitride, silicon oxycarbide, or silicon oxynitride. Between the gate cut feature 288 and the liner 284, the gate cut feature 288 is formed of a low-k dielectric material to reduce parasitic capacitance and the liner 284 is more etch-resistant to protect the gate electrode layer, such as the work function layers therein. In some alternative embodiments, the gate cut feature 288 may be a single layer or a multi-layer. When the gate cut feature 288 is a multi-layer, the gate cut feature 288 may include a dielectric liner in contact with the gate segments and a dielectric filler spaced apart from the gate segments by the dielectric liner. The dielectric liner and the dielectric filler may be formed of different materials. For example, the dielectric liner is oxygen-free while the dielectric filler includes oxygen. For another example, the dielectric liner may have a dielectric constant greater than that of the dielectric filler. When the gate cut feature 288 is a multi-layer, the dielectric liner may have a thickness between about 1 nm and about 6 nm. It is noted that, to better illustrate the features in the gate cut feature 288, the structures that intersect the cross-section D-D' are omitted from FIG. 10A. FIG. 10D illustrates the structures along the cross-section D-D'.

Figure 11A:
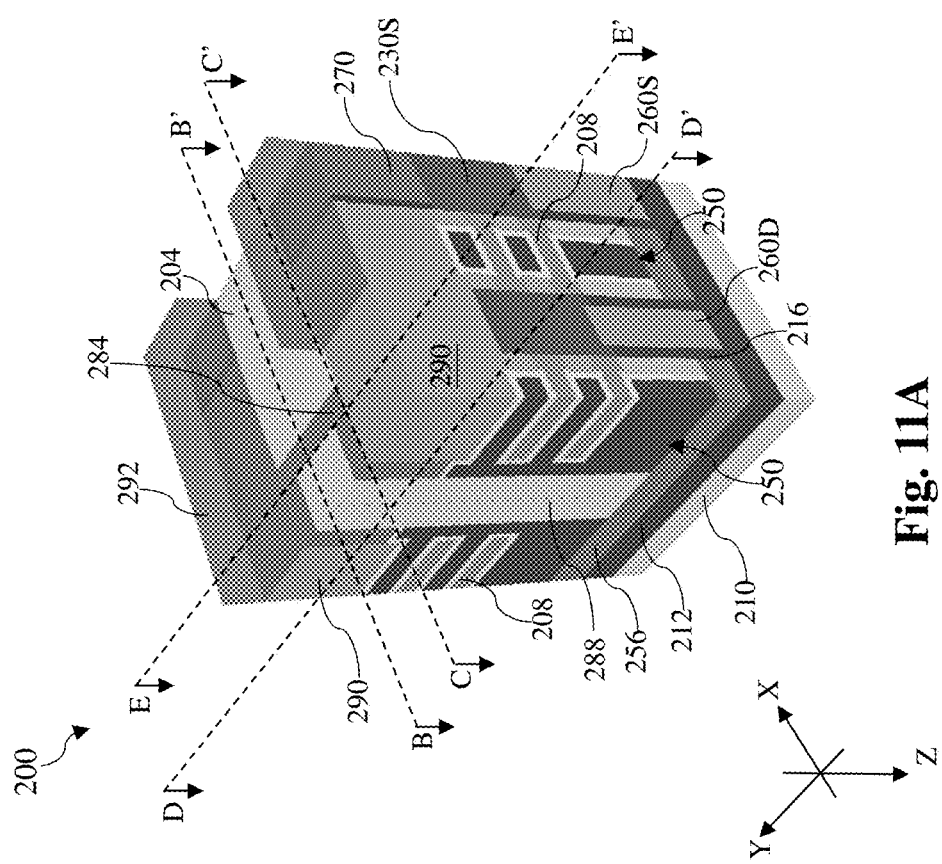

Referring to FIGS. 1 and 11A-11E, method 100 includes a block 118 where the first base portion 202-1 and the second base portion 202-2 are replaced with a backside dielectric layer 290. As shown in FIGS. 10A, 10C, 10D, and 10E, at conclusion of operations at block 116, the first base portion 202-1 and the second base portion 202-2 are surrounded by features formed of different materials, including the isolation feature 204, the liner 284, and the backside contacts 270. This arrangement allows the first base portion 202-1 and the second base portion 202-2 to be selectively removed. In some embodiments, the selective removal of the first base portion 202-1 and the second base portion 202-2 may be carried out using selective wet etching or selective dry etching. An example selective wet etch process may include use of ethylenediamine pyrocatechol (EDP), tetramethylammonium hydroxide (TMAH), nitric acid ($HNO_3$), hydrofluoric acid (HF), ammonia ($NH_3$), ammonium fluoride ($NH_4F$) or a suitable wet etchant. An example selective dry etch process may include sulfur hexafluoride ($SF_6$), hydrogen ($H_2$), ammonia ($NH_3$), hydrogen fluoride (HF), carbon tetrafluoride ($CF_4$), argon, or a mixture thereof. A backside dielectric layer 290 is then deposited to replace the removed first base portion 202-1 and second base portion 202-2. The backside dielectric layer 290 may include silicon oxide, silicon nitride, silicon carbide, silicon oxycarbonitride, silicon oxynitride, or silicon carbonitride and may be deposited using spin-on coating, CVD, FCVD, or plasma-enhanced CVD (PECVD). In some implementations, the backside dielectric layer 290 may be formed of a high-k dielectric material to provide sufficient protection of the gate structure even though the high-k dielectric material may slightly increase the parasitic capacitance. In some embodiments, before the deposition of the backside dielectric layer 290, a protective liner may be deposited over the back side of the workpiece 200 using CVD, ALD, or a suitable deposition technique, if the backside dielectric layer 290 includes oxygen. The protective liner functions to space the backside dielectric layer 290 from adjacent structures and may include silicon nitride. A planarization process, such as a CMP process, may be performed to remove excess materials such that top surfaces of the backside dielectric layer 290, the isolation feature 204, the gate cut feature 288, the liner 284, and the backside contacts 270 are coplanar. It is noted that, to better illustrate the features in the backside dielectric layer 290, the structures that intersect the cross-section D-D' are omitted from FIG. 11A. FIG. 11D illustrates the structures along the cross-section D-D'.

Referring to FIGS. 1 and 11A-11E, method 100 includes a block 120 where backside power rails 292 are formed. Formation of the backside power rails 292 may include deposition of an insulation layer 294 (not explicitly shown in FIG. 11A but shown in FIGS. 11B-11E), patterning the insulation layer 294 to form power rail trenches, and formation of the backside power rails 292 in the power rail trenches. The insulation layer 294 may have a composition similar to that of the ILD layer 234. The insulation layer 294 is deposited over the back side of the workpiece 200, including over the backside dielectric layer 290, the backside contacts 270, the isolation feature 204, the liner 284, and the gate cut feature 288. Then, power rail trenches are patterned in the insulation layer 294. The backside contacts 270 are exposed in the one or more power rail trenches. Thereafter, a metal fill material is deposited into the power rail trenches to form the backside power rails 292 that are electrically coupled to the backside contacts 270. In some embodiments, the metal fill material in the backside power rail may include titanium (Ti), tantalum (Ta), titanium nitride (TiN), tantalum nitride (TaN), ruthenium (Ru), tungsten (W), cobalt (Co), aluminum (Al), molybdenum (Mo), or a combination thereof. In some implementations, a barrier layer may be optionally deposited before the deposition of the metal fill material to separate the metal fill material from the insulation layer. The barrier layer may include titanium nitride (TiN), tantalum nitride (TaN), cobalt nitride (CoN), nickel nitride (NiN), or tungsten nitride (WN). When the barrier layer is formed, both the barrier layer and the metal fill material may be considered portions of the backside power rails 292. The barrier layer and the metal fill layer may be deposited using PVD, CVD, ALD, or electroless plating. A planarization process, such as a CMP process, may be performed to remove excess materials over the insulation layer. While not explicitly shown, further interconnect structures may be formed over the insulation layer 294 and the backside power rail 292.

Figures 11B, 11C:
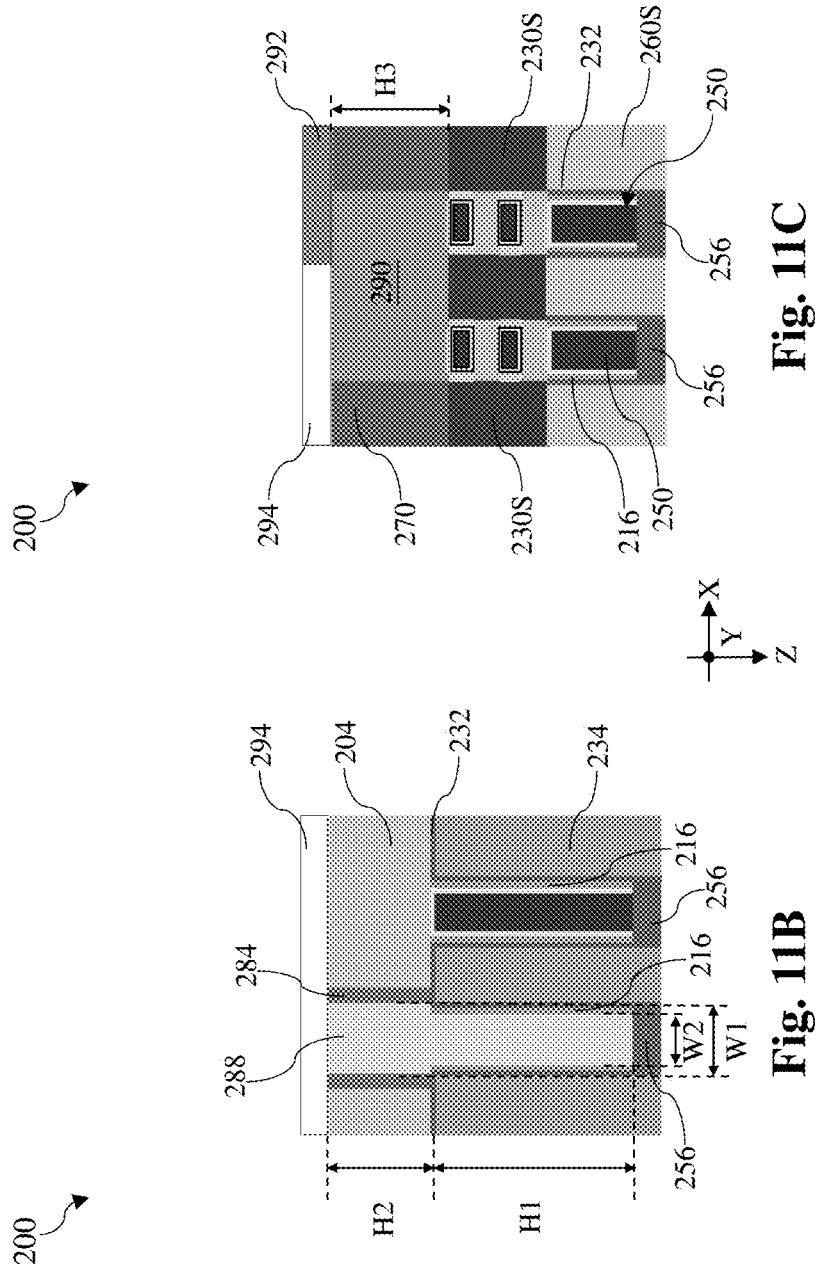

In FIG. 11B, the gate cut feature 288 includes a lower portion disposed between the gate spacers 216 and an upper portion disposed between the liners 284 along the X direction. Along the X direction, the lower portion includes a first width W1 and the upper portion includes a second width W2. In some instances, the first width W1 may be between about 6 nm and about 22 nm and the second width W2 may be between about 4 nm and about 22 nm. The lower portion includes a first height H1 and the upper portion includes a second height H2 along the Z direction. A sum of the first height H1 and the second height H2 may be between about 10 nm and about 80 nm. Referring to FIG. 11C, upon conclusion of the operations at block 120, the backside contact 270 may include a third height H3 between about 20 nm and about 40 nm. Referring to FIG. 11E, along the Y direction, the lower portion of the gate cut feature is disposed between the gate electrode portions of the gate segments and the upper portion is disposed between the liners 284. The workpiece 200 in FIGS. 11A-11E is flipped up-side-down. When the workpiece 200 in FIGS. 11A-11E is flipped back to an upright position, the insulation layer 294 would be at the bottom and the gate SAC dielectric layer 256 would be on the top.

Figure 13:
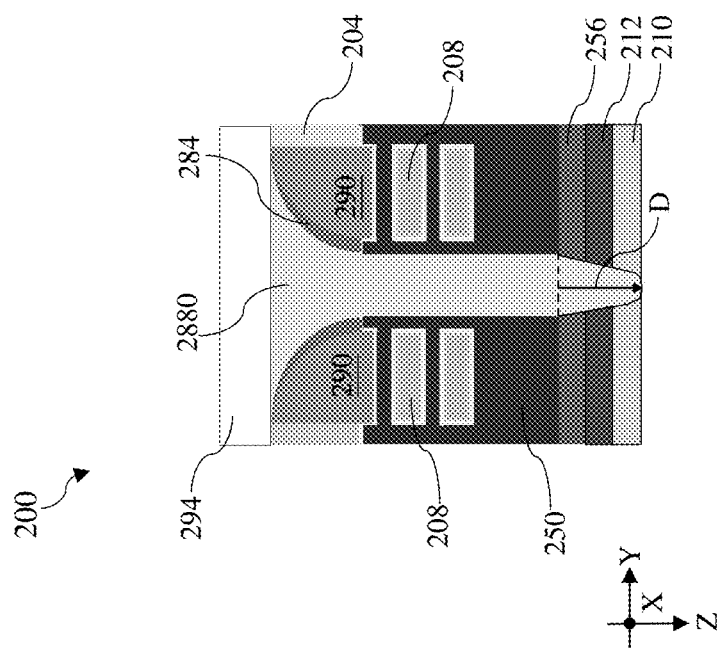
FIGS. 12-19 illustrate alternative semiconductor structures or intermediate structures fabricated using the method of FIG. 1, according to one or more aspects of the present disclosure.
Figure 12:
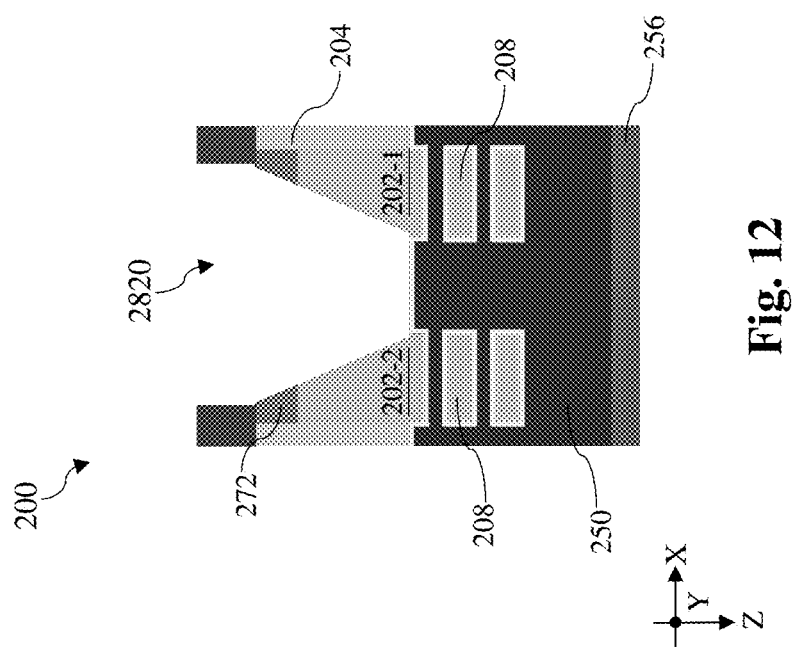

While FIGS. 7A, 7B and 7E illustrate that the pilot opening 282 includes substantially vertical sidewalls as result of the operations at block 110, pilot openings with tapered sidewalls are contemplated. Reference is made to FIG. 12. When the etch process at block 110 is not sufficiently anisotropic and selective, the helmet layer 272, the first base portion 202-1 and the second base portion 202-2 are also etched at block 110, resulting in a tapered pilot opening 2820. Referring to FIG. 13, the tapered pilot opening 2820 may have ripple effect to subsequent processes. As shown in FIG. 13, the liner 284 deposited in the tapered pilot opening 2820 and the tapered gate cut feature 2880 also inherit the tapered profile. That backside dielectric layer 290 that replaces the now wedge-shaped base portions may also include a wedge-like shape, when viewed along the X direction. FIG. 13 also illustrate an alternative embodiment where the gate cut opening or the tapered gate cut feature 2880 extends completely through the gate SAC dielectric layer 256. As shown in FIG. 13, the tapered gate cut feature 2880 may include a tapered tip portion that penetrates the gate SAC dielectric layer 256 into an etch stop layer (ESL) 212 and a top interlayer dielectric (ILD) layer 210. The ESL 212 and the top ILD layer 210 may be part of a frontside interconnect structure. The composition of the ESL 212 may be similar to the CESL 232 and the composition of the top ILD layer 210 may be similar to the ILD layer 234. As shown in FIG. 13, the tapered gate cut feature 2880 may have an over-etch depth D between about 3 nm and about 100 nm.

Figure 14:
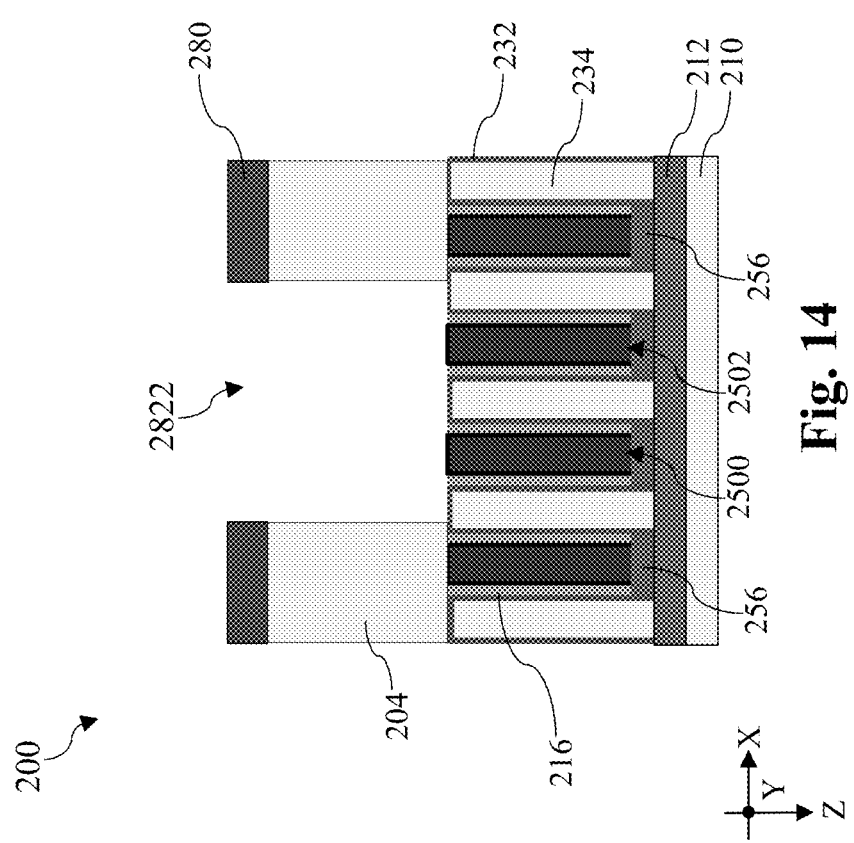
Figure 15:
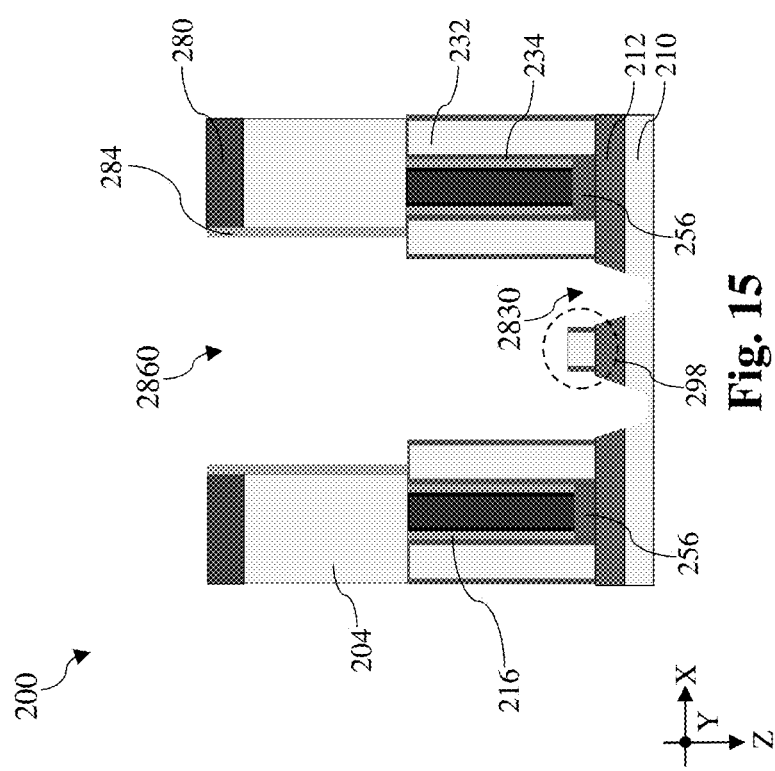
Figure 16:
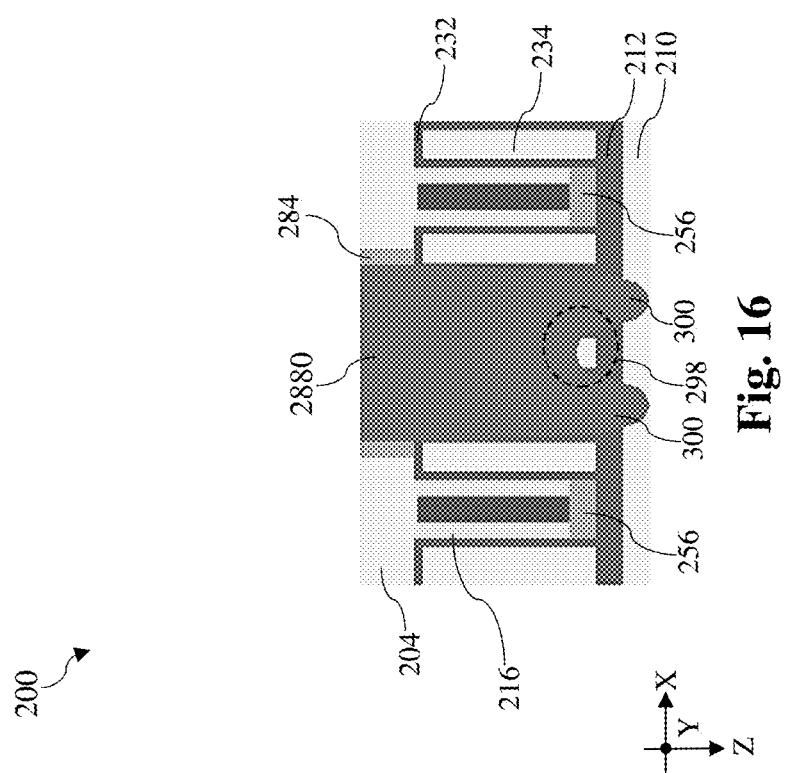

Gate cut features of the present disclosure may span across more than one joint gate structures. Referring to FIG. 14, a first slot pilot opening 2822 that spans across a first joint gate structure 2500 and a second joint gate structure 2502 may be formed at block 110 of the method 100. Referring then to FIG. 15, after formation of the liner 284, the first slot pilot opening 2822 is extended downward through the first joint gate structure 2500 and the second joint gate structure 2502 to form a first slot gate cut opening 2860. The first slot gate cut opening 2860 not only separates the first joint gate structure 2500 into two gate segments but also separates the second joint gate structure 2502 into two gate segments. In some implementations represented in FIG. 15, the etch process to form the first slot gate cut opening 2860 may etch the joint gate structures faster than it does the CESL 232 and the ILD layer 234. As a result, a dielectric island 298 may be formed. FIG. 15 also illustrates that the first slot gate cut opening 2860 may include overshoot portions 2830 that extend through the ESL 212 and the top ILD layer 210 below the gate SAC dielectric layer 256. In these alternative embodiments, as shown in FIG. 16, operations at block 116 may form a first slot gate cut feature 2880 that generally tracks the shape of the first slot gate cut opening 2860. When viewed from the Y direction, the first slot gate cut feature 2880 includes leg portions 300 and straddles the dielectric island 298. The composition of the first slot gate cut feature 2880 may be similar to the gate cut feature 288 described above. The workpiece 200 in FIG. 16 is flipped up-side-down. When the workpiece 200 in FIG. 16 is flipped back to an upright position, the isolation feature 204 would be at the bottom and the two leg portions 300 would point upward.

Figure 17:
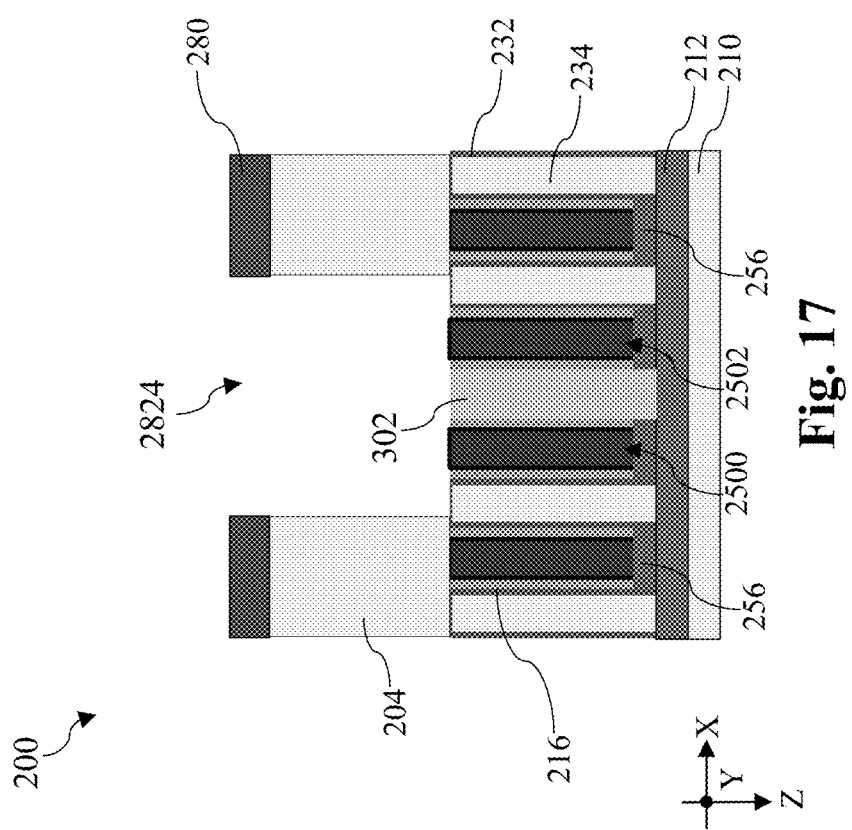
Figure 18:
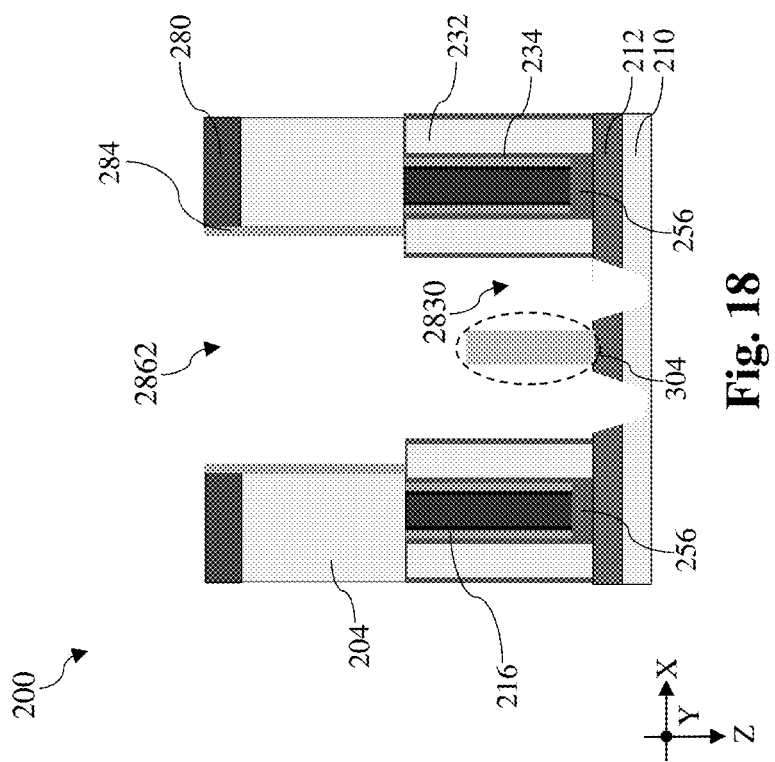
Figure 19:
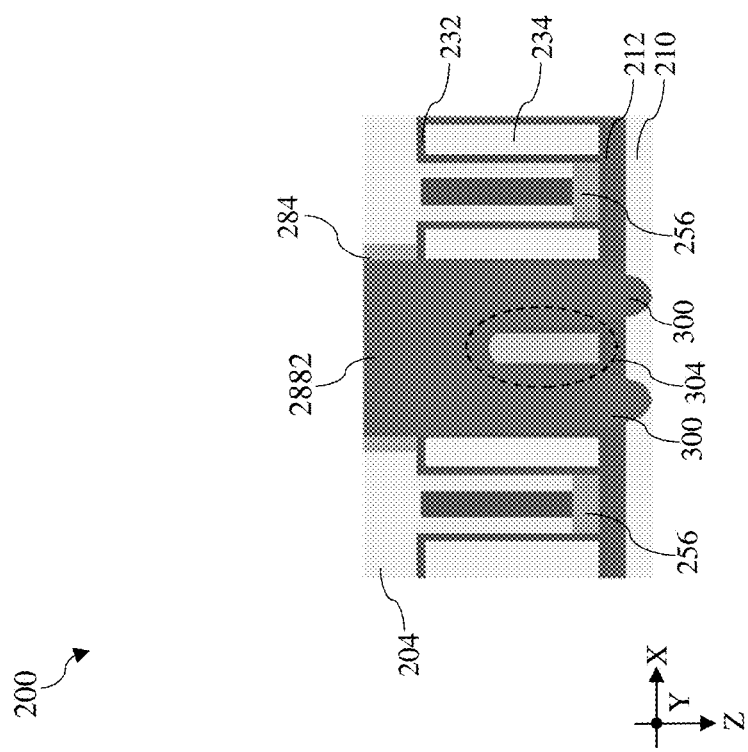

Gate cut features of the present disclosure may span across a slot source/drain contact. Referring to FIG. 17, a second slot pilot opening 2824 that spans across a first joint gate structure 2500, a second joint gate structure 2502, and a slot source/drain contact 302 may be formed at block 110 of the method 100. Referring then to FIG. 18, after formation of the liner 284, the second slot pilot opening 2824 is extended downward through the first joint gate structure 2500 and the second joint gate structure 2502 to form a second slot gate cut opening 2862. The second slot gate cut opening 2862 not only separates the first joint gate structure 2500 into two gate segments aligned along the Y direction but also separates the second joint gate structure 2502 into two gate segments aligned along the Y direction. In some implementations represented in FIG. 18, the etch process to form the second slot gate cut opening 2862 may etch the joint gate structures faster than it does the slot source/drain contact 302. As a result, a metal island 304 may be formed. FIG. 18 also illustrates that the second slot gate cut opening 2862 may include overshoot portions 2830 that extend through the ESL 212 and the top ILD layer 210 below the gate SAC dielectric layer 256. In these alternative embodiments, as shown in FIG. 19, operations at block 116 may form a second slot gate cut feature 2882 that generally tracks the shape of the second slot gate cut opening 2862. When viewed from the Y direction, the second slot gate cut feature 2882 includes leg portions 300 and straddles the metal island 304. The composition of the second slot gate cut feature 2882 may be similar to the gate cut feature 288 described above. The workpiece 200 in FIG. 19 is flipped up-side-down. When the workpiece 200 in FIG. 19 is flipped back to an upright position, the isolation feature 204 would be at the bottom and the two leg portions 300 would point upward.

Embodiments of the present disclosure provide advantages. For example, methods of the present disclosure form gate cut features from a back side of a workpiece. Using structures on the back side of the workpiece and a helmet layer, the formation of the gate cut opening of the present disclosure is self-aligned and does not rely on high resolution or high overlay precision of the photolithography process.

In one exemplary aspect, the present disclosure is directed to a semiconductor device. The semiconductor device includes a first gate structure disposed over a first backside dielectric feature, a second gate structure disposed over a second backside dielectric feature, a gate cut feature extending continuously from between the first gate structure and the second gate structure to between the first backside dielectric feature and the second backside dielectric feature, and a liner disposed between the gate cut feature and the first backside dielectric feature and between the gate cut feature and the second backside dielectric feature.

In some embodiments, the first gate structure and the second gate structure are disposed over the liner. In some implementations, the semiconductor device may further include a gate spacer that extend from a sidewall of the first gate structure to a sidewall of the second gate structure and the gate cut feature is in contact with the gate spacer. In some instances, the gate cut feature is in direct contact with the first gate structure and the second gate structure. In some instances, the semiconductor device may further include a self-aligned contact (SAC) dielectric layer disposed over the first gate structure and the second gate structure, an etch stop layer over the SAC dielectric layer, and a dielectric layer over the etch stop layer. The gate cut feature extends into the SAC dielectric layer, the etch stop layer, and the dielectric layer. In some embodiments, the first backside dielectric feature includes silicon oxide, silicon nitride, silicon carbide, silicon oxycarbonitride, silicon oxynitride, or silicon carbonitride. In some embodiments, the liner includes silicon nitride, silicon carbonitride, silicon oxycarbonitride, silicon oxycarbide, or silicon oxynitride. In some instances, the gate cut feature includes silicon nitride, silicon carbonitride, silicon oxycarbonitride, silicon oxycarbide, or silicon oxynitride.

In another exemplary aspect, the present disclosure is directed to a semiconductor structure. The semiconductor structure includes a dielectric layer, a contact etch stop layer (CESL) disposed over the dielectric layer, an isolation feature disposed over the CESL, and a gate cut feature extending through the isolation feature, the CESL, and the dielectric layer. The gate cut feature is disposed between a first gate structure and a second gate structure as well as between a third gate structure and a fourth gate structure.

In some embodiments, the first gate structure and the second gate structure are aligned along a direction and the third gate structure and the fourth gate structure are aligned along the direction. In some implementations, the gate cut feature is spaced apart from the isolation feature by a liner. In some instances, the dielectric layer is disposed over an etch stop layer and a top dielectric layer and the gate cut feature includes two leg portions, each of which extends into the etch stop layer and the top dielectric layer. In some embodiments, the semiconductor structure may further include a metal feature disposed between the two leg portions such that the gate cut feature straddles the metal feature. In some embodiments, the semiconductor structure may further include a dielectric feature disposed between the two leg portions such that the gate cut feature straddles the dielectric feature.

In yet another exemplary aspect, the present disclosure is directed to a method. The method includes forming a first plurality of channel members over a first substrate portion of a workpiece and a second plurality of channel members over a second substrate portion of the workpiece, the first substrate portion and the second substrate portion being spaced apart by an isolation feature, forming a joint gate structure to wrap around each of the first plurality of channel members and each of the second plurality of channel members, flipping the workpiece over, after the flipping, forming a pilot opening through the isolation feature, extending the pilot opening through the joint gate structure to form a gate cut opening that separates the joint gate structure into a first gate structure and a second gate structure, and after the extending, depositing a dielectric material into the gate cut opening to form a gate cut feature.

In some embodiments, the method may further include before the forming of the pilot opening, recessing the first substrate portion and the second substrate portion and after the recessing, depositing a helmet layer over the first substrate portion and the second substrate portion. In some implementations, the forming of the pilot opening includes depositing a hard mask over the helmet layer and the isolation feature, patterning the hard mask to expose a portion of the isolation feature and a portion of the helmet layer, and etching the isolation feature using the patterned hard mask and the helmet layer as an etch mask. In some instances, the helmet layer includes aluminum oxide, hafnium oxide, zirconium oxide, titanium oxide, zinc oxide, cobalt (Co), titanium (Ti), tantalum (Ta), ruthenium (Ru), or tungsten (W). In some embodiments, the method may further include after the forming of the pilot opening, depositing a liner over sidewalls of the pilot opening. In some instances, the method may further include before the flipping, forming a self-aligned contact (SAC) dielectric layer over the joint gate structure. The extending also extends the pilot opening through the SAC dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first gate structure disposed over a first backside dielectric feature;
a second gate structure disposed over a second backside dielectric feature;
a gate cut feature extending continuously from between the first gate structure and the second gate structure to between the first backside dielectric feature and the second backside dielectric feature; and
a liner disposed between the gate cut feature and the first backside dielectric feature and between the gate cut feature and the second backside dielectric feature.

2. The semiconductor device of claim 1, wherein the first gate structure and the second gate structure are disposed over the liner.

3. The semiconductor device of claim 1, further comprising:
a gate spacer that extend from a sidewall of the first gate structure to a sidewall of the second gate structure,
wherein the gate cut feature is in contact with the gate spacer.

4. The semiconductor device of claim 1, wherein the gate cut feature is in direct contact with the first gate structure and the second gate structure.

5. The semiconductor device of claim 1, further comprising:
a self-aligned contact (SAC) dielectric layer disposed over the first gate structure and the second gate structure;
an etch stop layer over the SAC dielectric layer; and
a dielectric layer over the etch stop layer,
wherein the gate cut feature extends into the SAC dielectric layer, the etch stop layer, and the dielectric layer.

6. The semiconductor device of claim 1, wherein the first backside dielectric feature comprises silicon oxide, silicon nitride, silicon carbide, silicon oxycarbonitride, silicon oxynitride, or silicon carbonitride.

7. The semiconductor device of claim 1, wherein the liner comprises silicon nitride, silicon carbonitride, silicon oxycarbonitride, silicon oxycarbide, or silicon oxynitride.

8. The semiconductor device of claim 1, wherein the gate cut feature comprises silicon nitride, silicon carbonitride, silicon oxycarbonitride, silicon oxycarbide, or silicon oxynitride.

9. A semiconductor structure, comprising:
a dielectric layer;
a contact etch stop layer (CESL) disposed over the dielectric layer;
an isolation feature disposed over the CESL; and
a gate cut feature extending through the isolation feature, the CESL, and the dielectric layer, wherein the gate cut feature is disposed between a first gate structure and a second gate structure as well as between a third gate structure and a fourth gate structure,
wherein the dielectric layer is disposed over an etch stop layer and a top dielectric layer,
wherein the gate cut feature comprises two leg portions, each of which extends into the etch stop layer and the top dielectric layer.

10. The semiconductor structure of claim 9,
wherein the first gate structure and the second gate structure are aligned along a direction,
wherein the third gate structure and the fourth gate structure are aligned along the direction.

11. The semiconductor structure of claim 9, wherein the gate cut feature is spaced apart from the isolation feature by a liner.

12. The semiconductor structure of claim 9, further comprising:
a metal feature disposed between the two leg portions such that the gate cut feature straddles the metal feature.

13. The semiconductor structure of claim 9, further comprising:
a dielectric feature disposed between the two leg portions such that the gate cut feature straddles the dielectric feature.

14. The semiconductor structure of claim 9, wherein the metal feature is disposed on the etch stop layer.

15. A method, comprising:
forming a first plurality of channel members over a first substrate portion of a workpiece and a second plurality of channel members over a second substrate portion of the workpiece, the first substrate portion and the second substrate portion being spaced apart by an isolation feature;
forming a joint gate structure to wrap around each of the first plurality of channel members and each of the second plurality of channel members;
flipping the workpiece over;
after the flipping, forming a pilot opening through the isolation feature;
extending the pilot opening through the joint gate structure to form a gate cut opening that separates the joint gate structure into a first gate structure and a second gate structure; and
after the extending, depositing a dielectric material into the gate cut opening to form a gate cut feature.

16. The method of claim 15, further comprising:
before the forming of the pilot opening, recessing the first substrate portion and the second substrate portion; and
after the recessing, depositing a helmet layer over the first substrate portion and the second substrate portion.

17. The method of claim 16, wherein the forming of the pilot opening comprises:
depositing a hard mask over the helmet layer and the isolation feature;
patterning the hard mask to expose a portion of the isolation feature and a portion of the helmet layer; and
etching the isolation feature using the patterned hard mask and the helmet layer as an etch mask.

18. The method of claim 16, the helmet layer comprises aluminum oxide, hafnium oxide, zirconium oxide, titanium oxide, zinc oxide, cobalt (Co), titanium (Ti), tantalum (Ta), ruthenium (Ru), or tungsten (W).

19. The method of claim 15, further comprising:
after the forming of the pilot opening, depositing a liner over sidewalls of the pilot opening.

20. The method of claim 15, further comprising:
before the flipping, forming a self-aligned contact (SAC) dielectric layer over the joint gate structure, wherein the extending also extends the pilot opening through the SAC dielectric layer.

\* \* \* \* \*